US010079335B2

(12) United States Patent
Ahn et al.

(10) Patent No.: US 10,079,335 B2
(45) Date of Patent: Sep. 18, 2018

(54) SMART SOFT COMPOSITE ACTUATOR

(75) Inventors: Sung Hoon Ahn, Seongnam-si (KR);
Hyung Jung Kim, Seongnam-si (KR);
Gil Yong Lee, Seoul (KR); Kyung Tae Lee, Seoul (KR); Renzhe Wu, Seoul (KR); Ji Soo Kim, Seoul (KR); Sung Hyuk Song, Siheung-si (KR)

(73) Assignee: SNU R&DB Foundation, Seoul (KR)

( * ) Notice: Subject to any disclaimer, the term of this patent is extended or adjusted under 35 U.S.C. 154(b) by 1117 days.

(21) Appl. No.: 14/346,682

(22) PCT Filed: Jan. 25, 2012

(86) PCT No.: PCT/KR2012/000603
§ 371 (c)(1),
(2), (4) Date: May 13, 2014

(87) PCT Pub. No.: WO2013/015503
PCT Pub. Date: Jan. 31, 2013

(65) Prior Publication Data
US 2015/0001994 A1   Jan. 1, 2015

(30) Foreign Application Priority Data

Jul. 22, 2011 (KR) .......................... 10-2011-0073085
Sep. 28, 2011 (KR) .......................... 10-2011-0098619

(51) Int. Cl.
*H01L 41/18* (2006.01)
*H01L 41/09* (2006.01)
*F03G 7/06* (2006.01)

(52) U.S. Cl.
CPC .......... *H01L 41/0966* (2013.01); *F03G 7/065* (2013.01); *H01L 41/094* (2013.01); *H01L 41/096* (2013.01)

(58) Field of Classification Search
CPC ............... B06B 1/0603; H01L 41/1134; H01L 41/0966; H01L 41/094; H01L 41/096; F03G 7/065
(Continued)

(56) References Cited

U.S. PATENT DOCUMENTS 7,321,185 B2 * 1/2008 Schultz .................... B64C 3/52
310/26
7,888,846 B2 * 2/2011 Ohtera ..................... H02N 2/02
310/311
(Continued)

FOREIGN PATENT DOCUMENTS

JP   2000-236682 A   8/2000
JP   2003-152234 A   5/2003
(Continued)

OTHER PUBLICATIONS

Abstract for JP 2003-152234; http://worldwide.espacenet.com; May 23, 2003.
(Continued)

*Primary Examiner* — Bryan Gordon
(74) *Attorney, Agent, or Firm* — Andrew D. Fortney; Central California IP Group, P.C.

(57) ABSTRACT

Disclosed is a smart soft composite actuator which enables user-desiring deformation by changing the position of smart material functioning as an active component, wherein the smart soft composite actuator comprises a smart material whose shape is changeable based on an external signal; and a matrix for supporting the smart material and determining an external shape, wherein the smart material is positioned inside the matrix or in a surface of the matrix, and at least one of in-plane shear deformation and out-of-plane deformation is realized by controlling the position of smart material.

20 Claims, 26 Drawing Sheets

(58) Field of Classification Search
USPC .......................................... 310/330, 331, 332
See application file for complete search history.

(56) References Cited

U.S. PATENT DOCUMENTS

| | | |
|---|---|---|
| 8,203,254 B2 | 6/2012 | Takahashi |
| 2003/0173867 A1* | 9/2003 | Mauchamp ........... B06B 1/0622 310/311 |
| 2006/0201149 A1* | 9/2006 | Biggs ................... H01H 1/0036 60/527 |
| 2007/0091148 A1* | 4/2007 | Onozawa ................. B05B 5/08 347/67 |
| 2009/0251027 A1* | 10/2009 | Kudoh .................. B81B 3/0075 310/330 |
| 2010/0253180 A1 | 10/2010 | Ohtera et al. |
| 2011/0120115 A1* | 5/2011 | Alexander ................ F02G 5/04 60/527 |
| 2012/0032564 A1 | 2/2012 | Takahashi |
| 2012/0228999 A1* | 9/2012 | Yamamoto .............. F03G 7/005 310/330 |

FOREIGN PATENT DOCUMENTS

| | | |
|---|---|---|
| WO | 2009/084323 A1 | 7/2009 |
| WO | 2010/137604 A1 | 12/2010 |

OTHER PUBLICATIONS

Abstract for JP 2000-236682; http://worldwide.espacenet.com; Aug. 29, 2000.
Wang, et al.; A Micro Biomimetic Manta Ray Robot Fish Actuated by SMA; Proceedings of the IEEE International Conference on Robotics and Biomimetics; Dec. 19-23, 2009, Guilin, China.
International Search Report; PCT/KR2012/000603; dated Sep. 26, 2012.

* cited by examiner

[Figure 1]
(a)
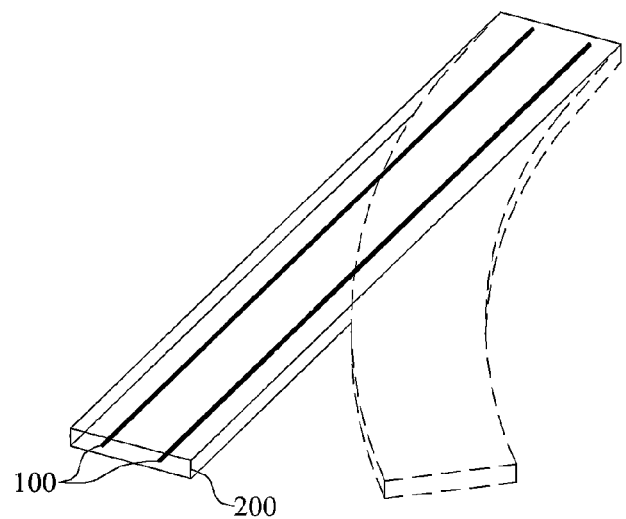
(b)
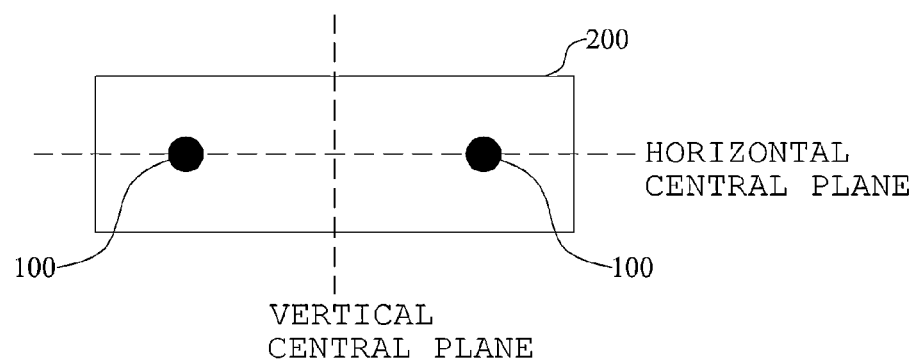

[Figure 2]
(a)
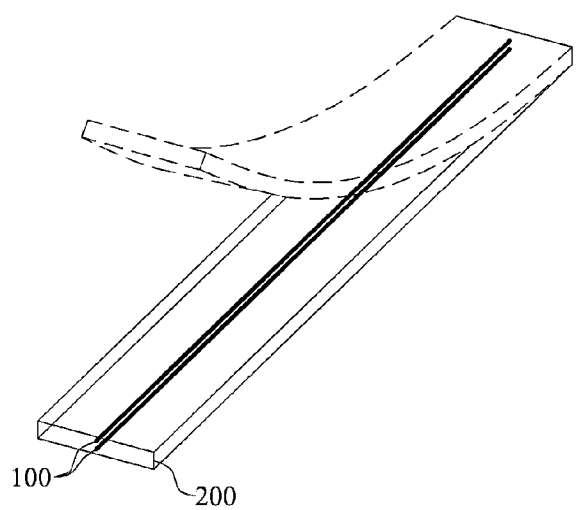
(b)
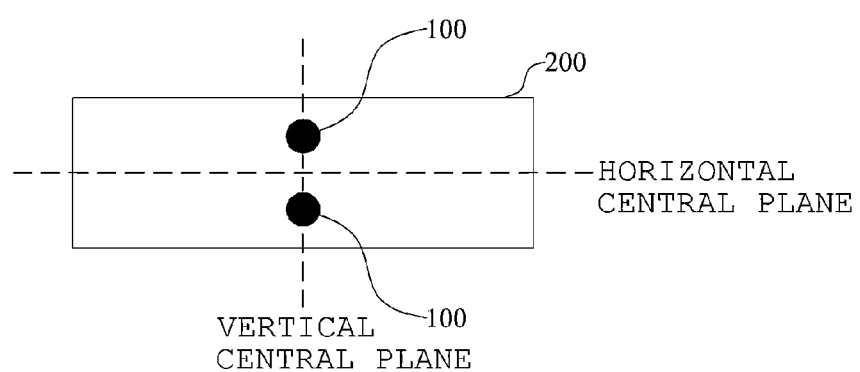

【Figure 3】
(a)
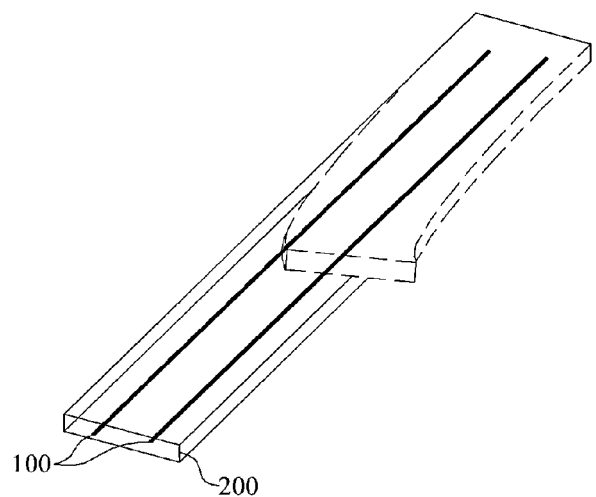
(b)
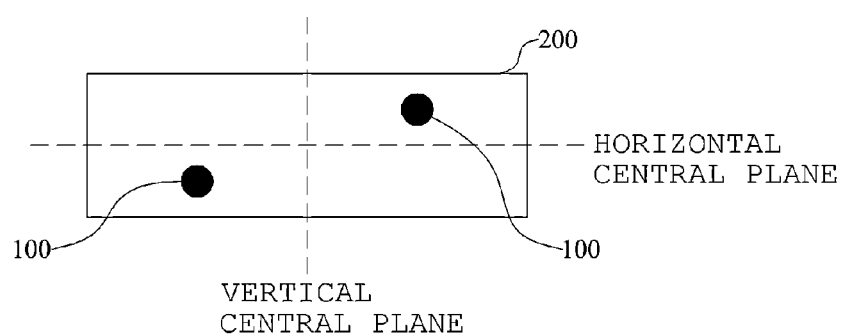

[Figure 4]
(a)
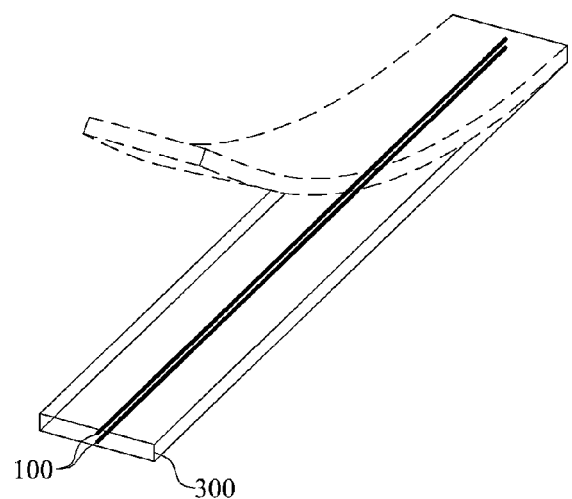
(b)
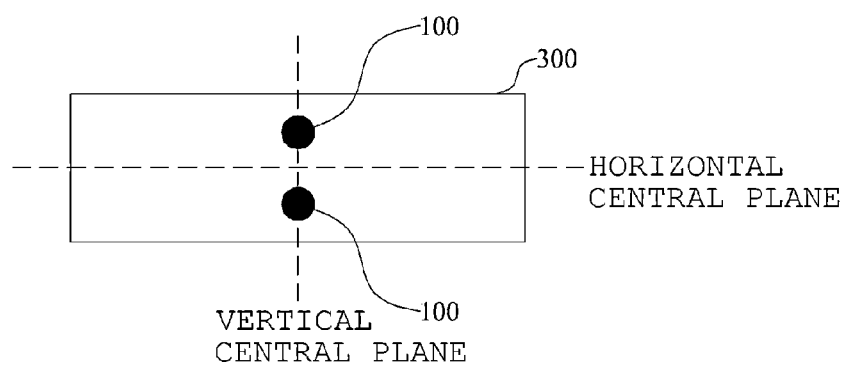

【Figure 5】
(a)
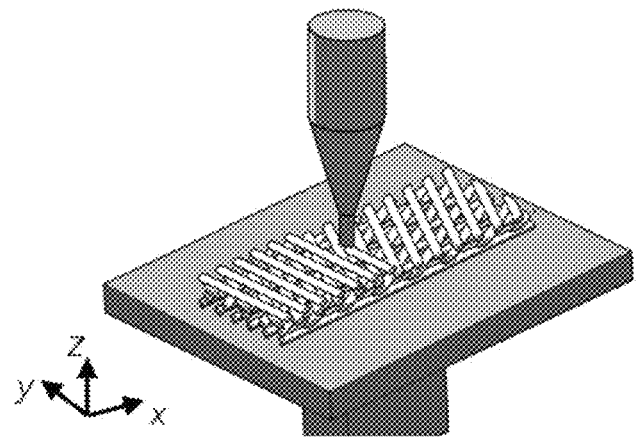
(b)
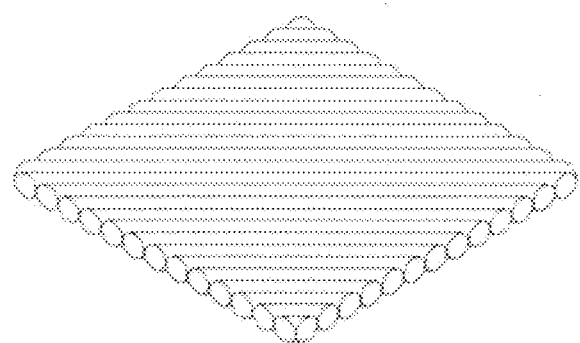
(c)
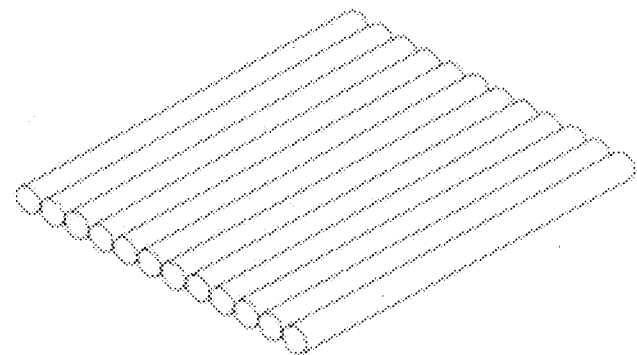

【Figure 6】
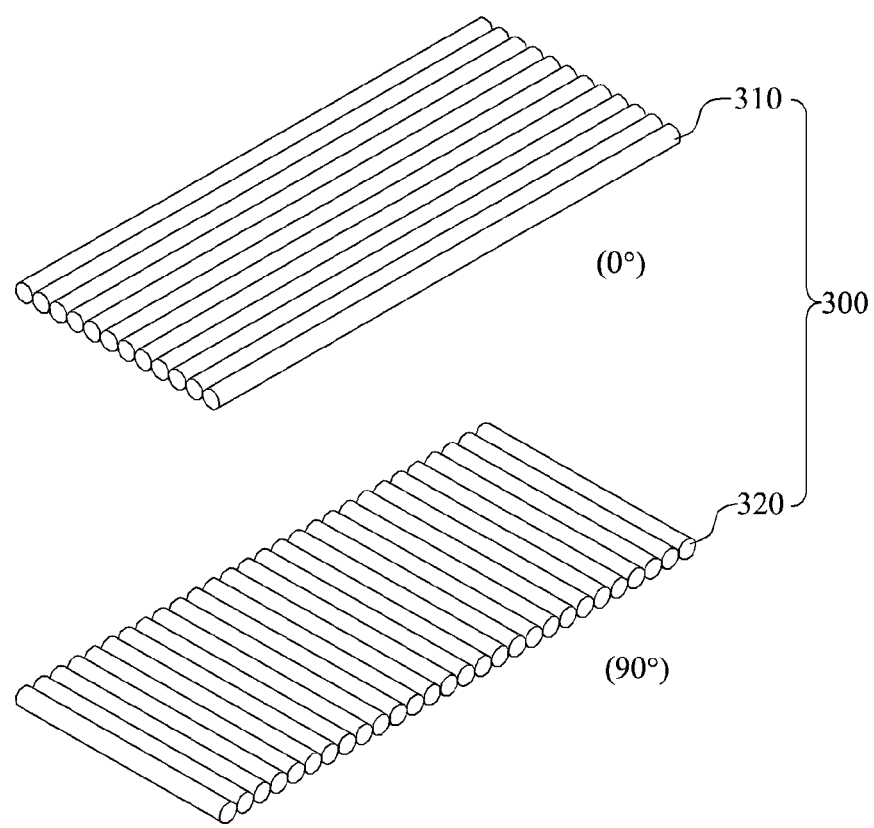

【Figure 7】
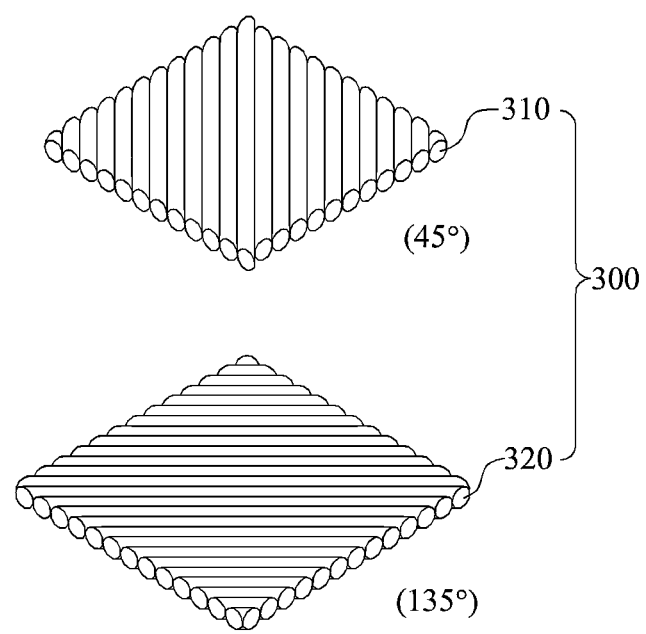

[Figure 8]
(a)
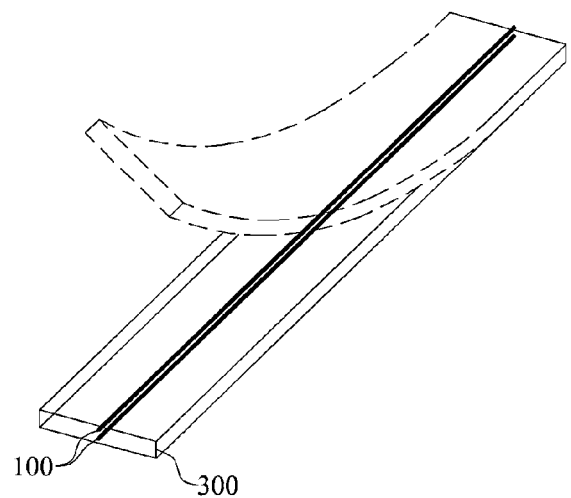
(b)
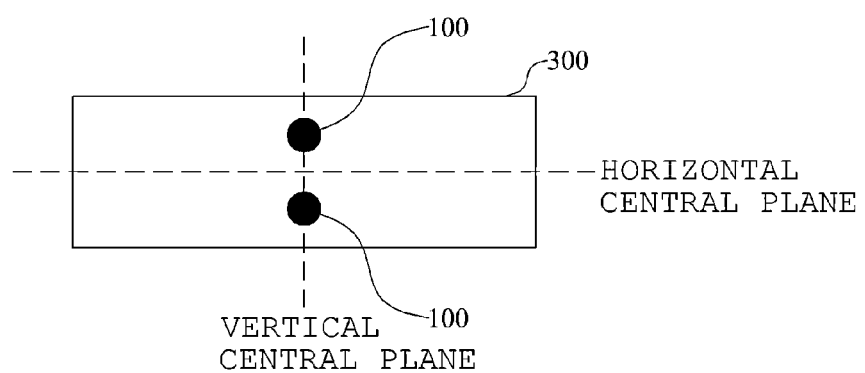

[Figure 9]
(a)
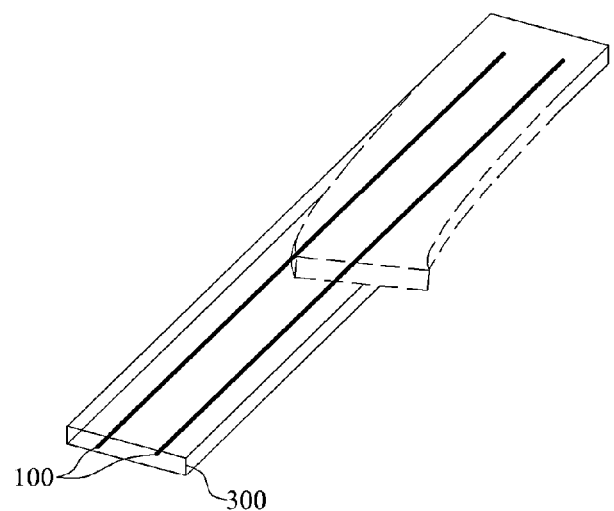
(b)
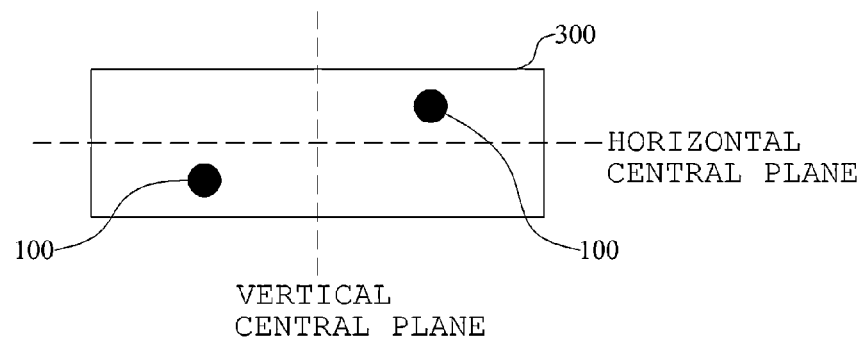

【Figure 10】
(a)
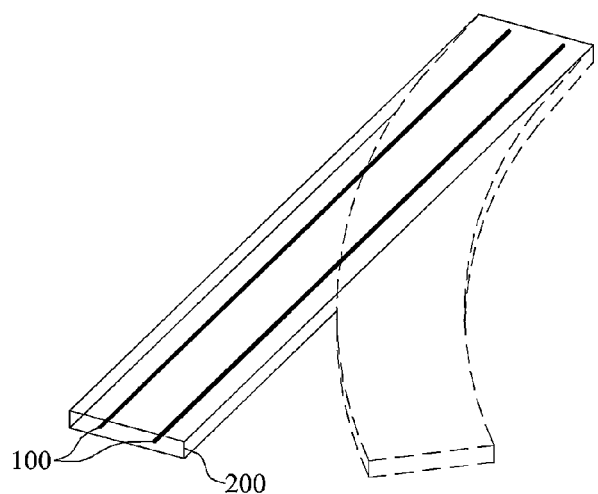
(b)
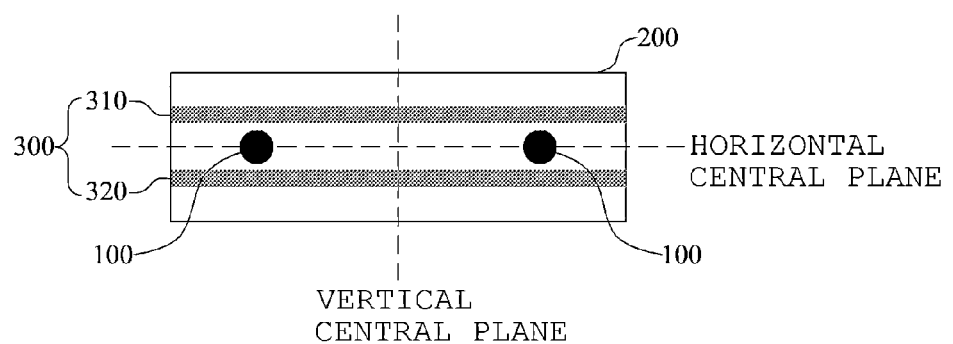

【Figure 11】
(a)
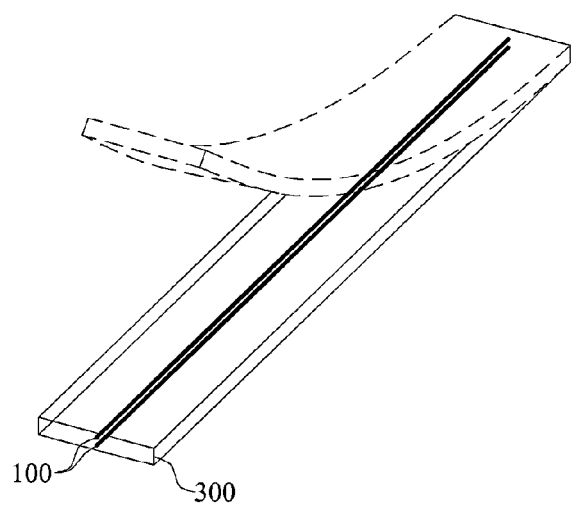
(b)
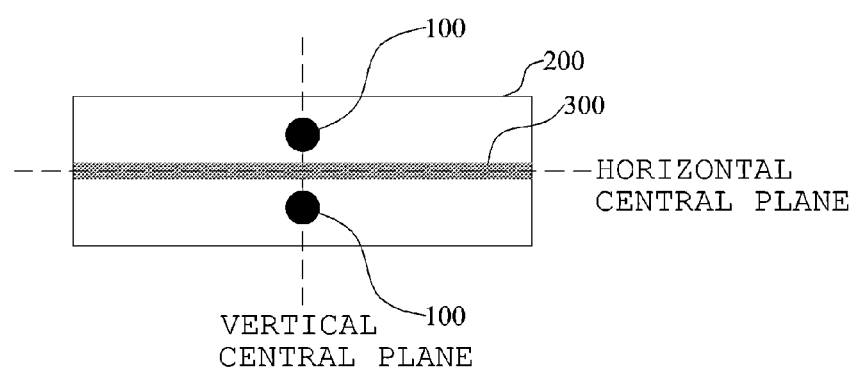

[Figure 12]
(a)
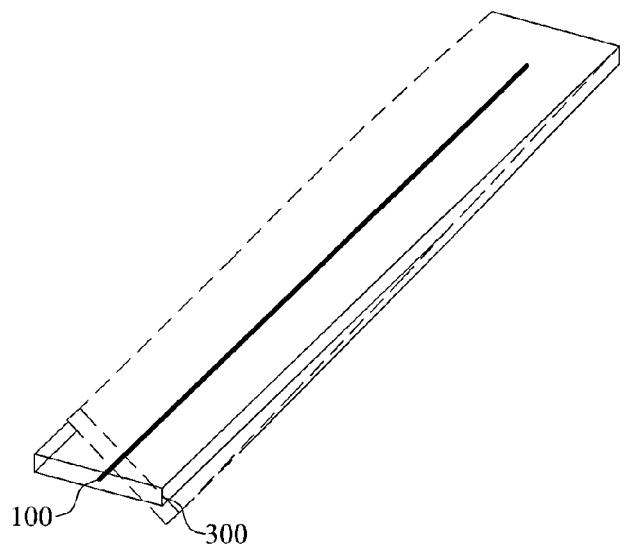
(b)
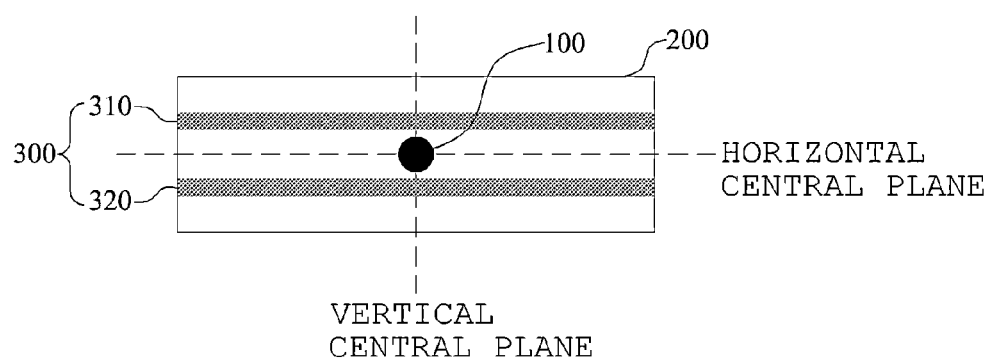

【Figure 13】
(a)
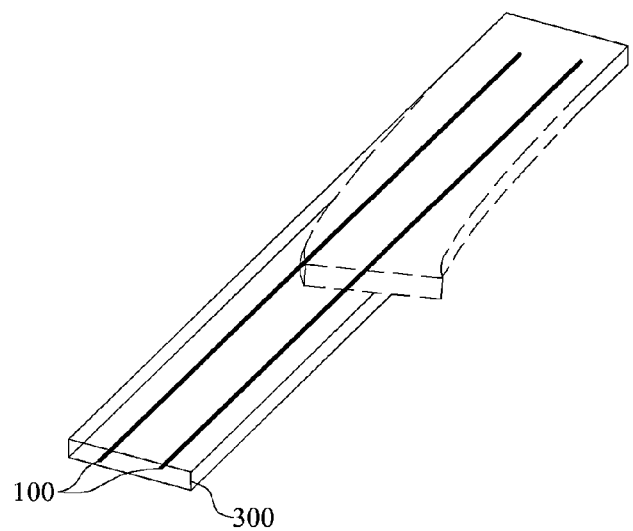
(b)
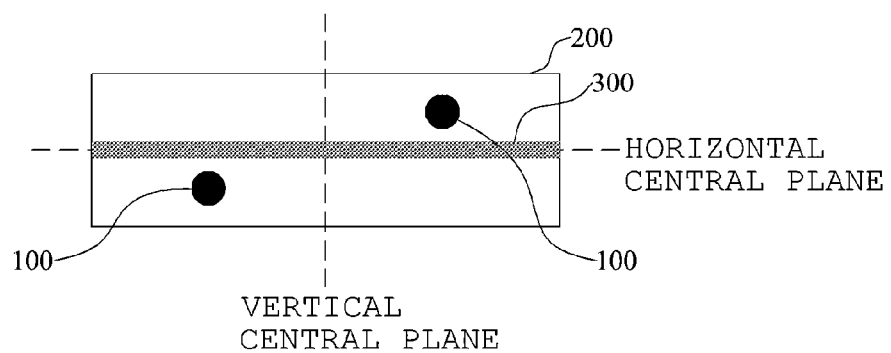

[Figure 14]
(a)
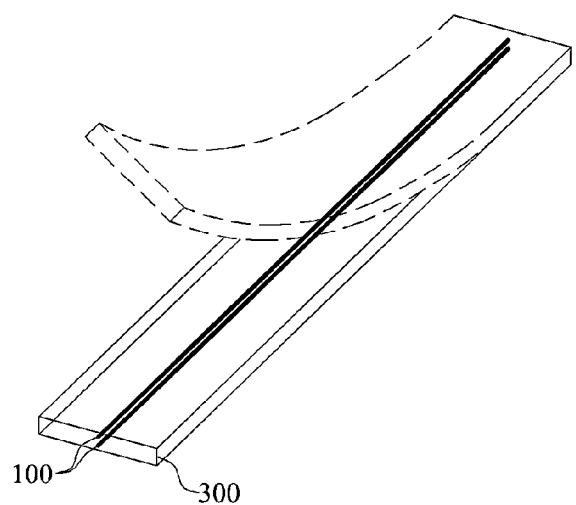
(b)
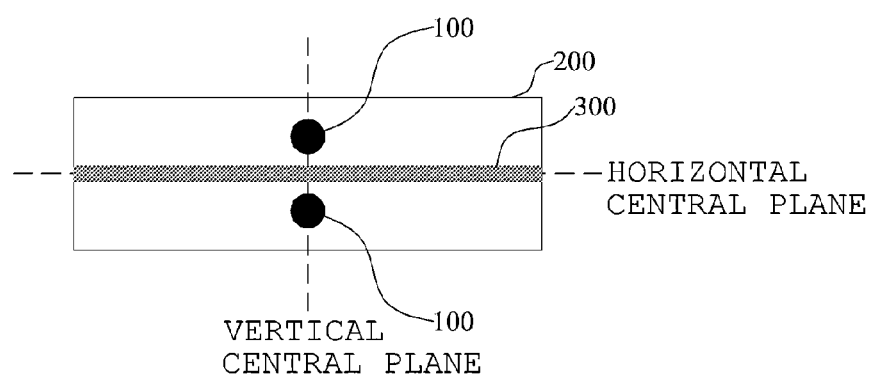

【Figure 15】
(a)
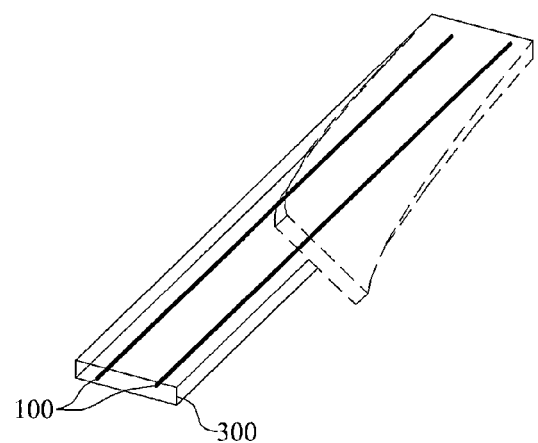
(b)
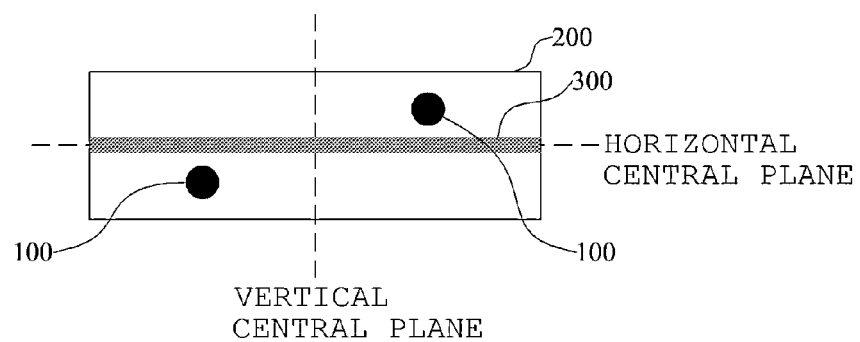

【Figure 16】
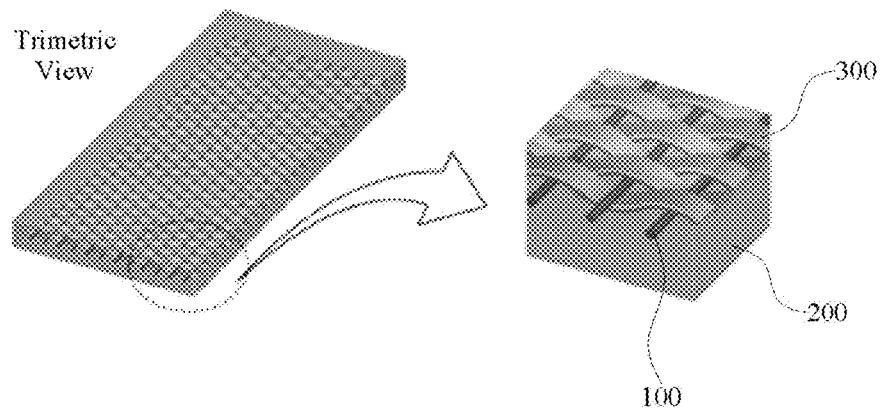
【Figure 17】
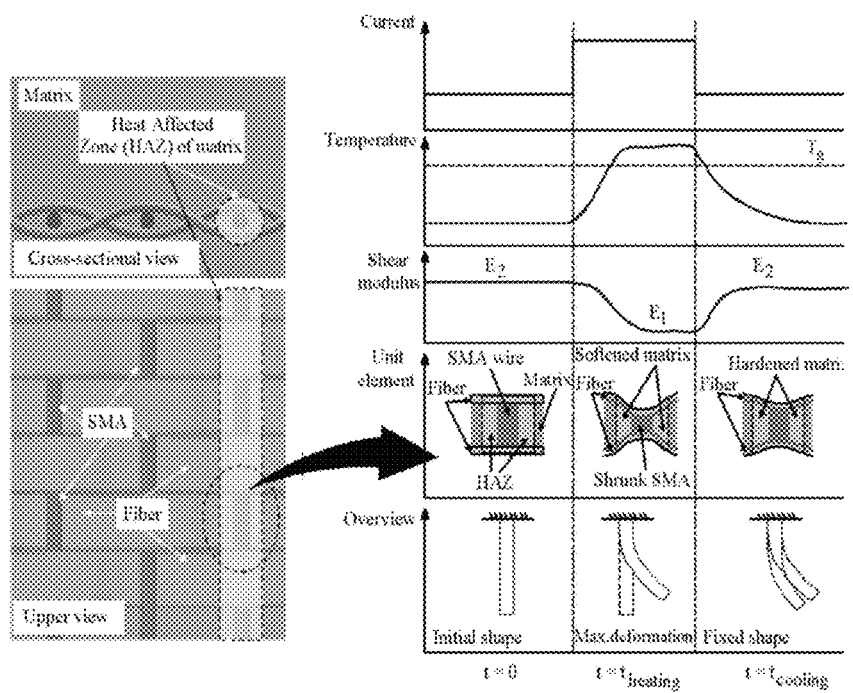
Shape fixable mechanism using phase change of hybrid matrix 【Figure 18】
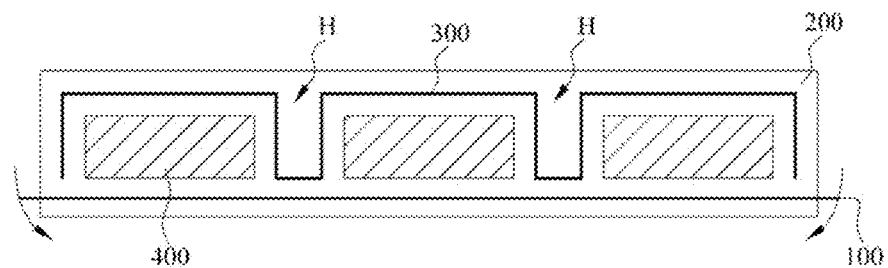
【Figure 19】
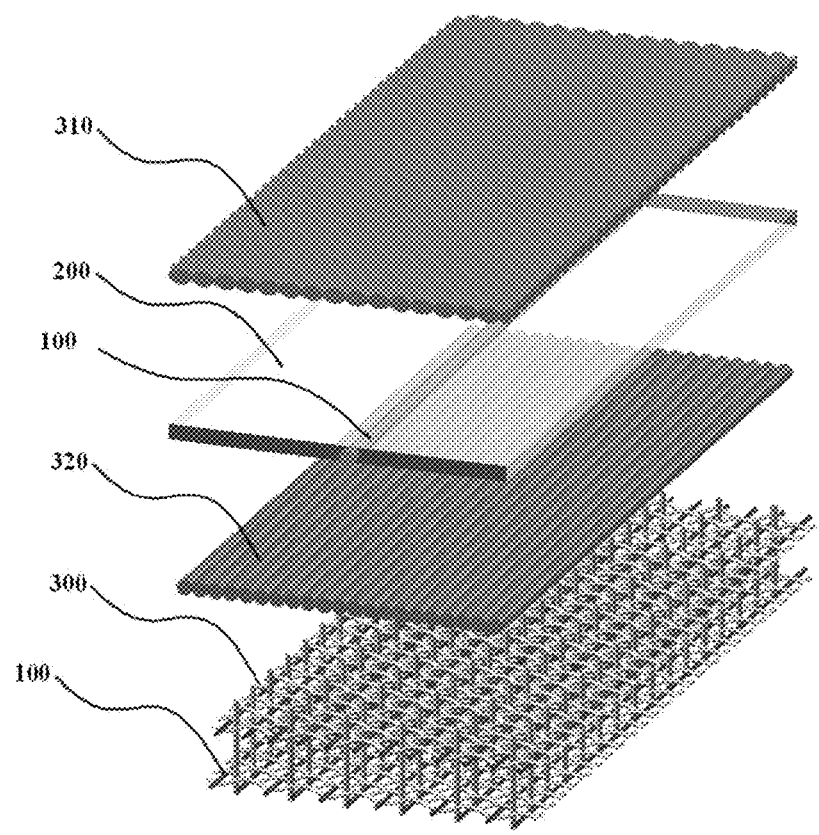

[Figure 20]
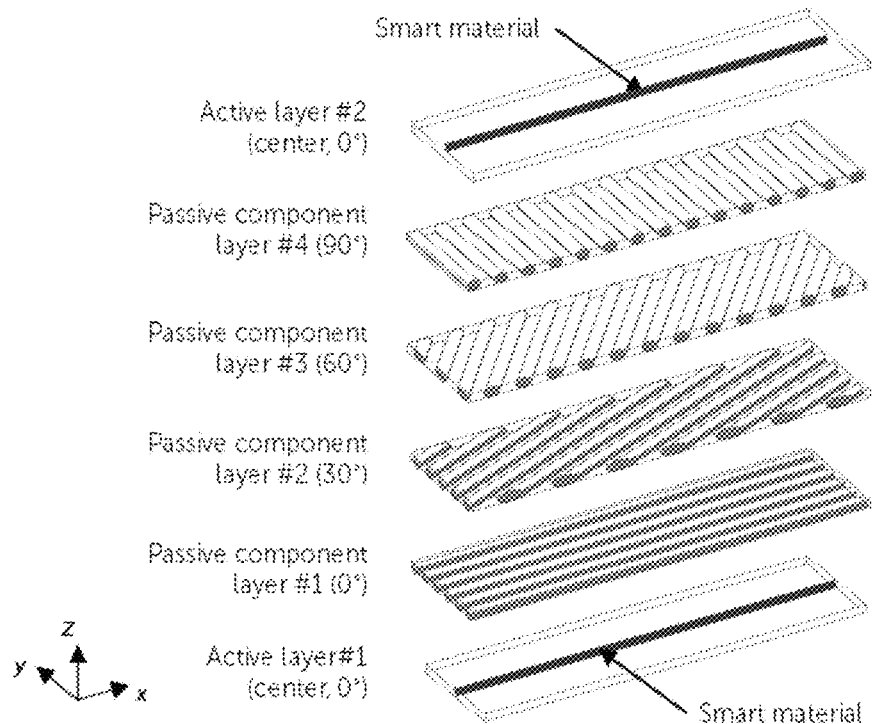
[Figure 21]
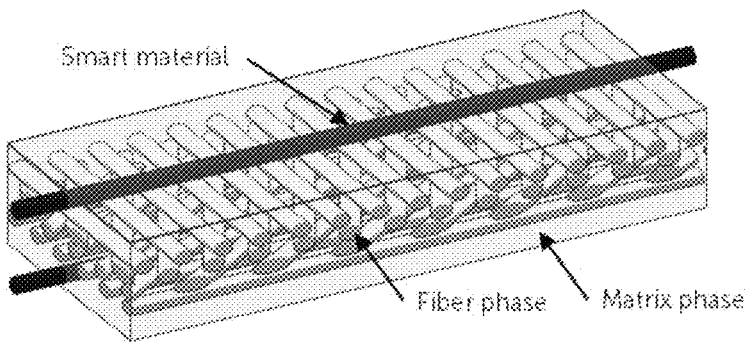

[Figure 22]
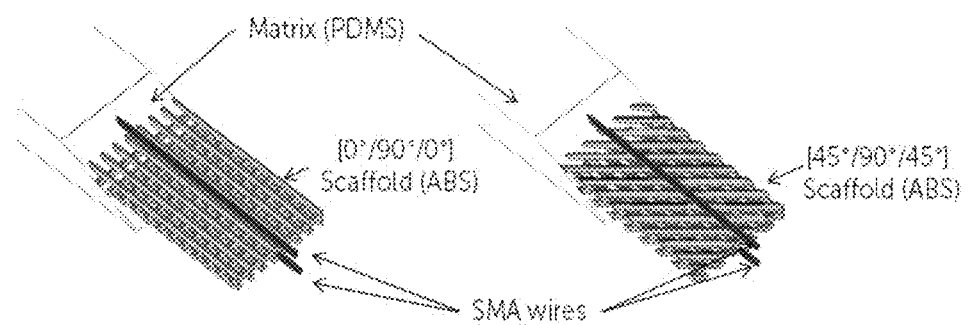

[Figure 23]
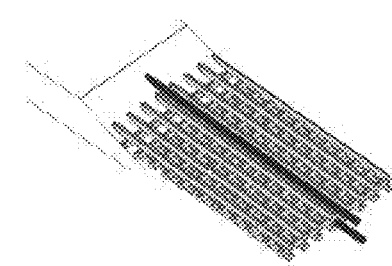
[0°/90°/0°] scaffold actuator
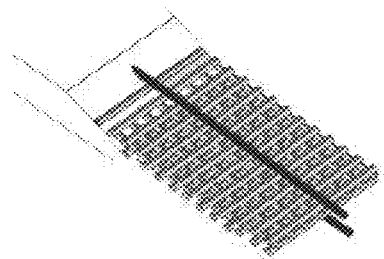
[90°/0°/90°] scaffold actuator
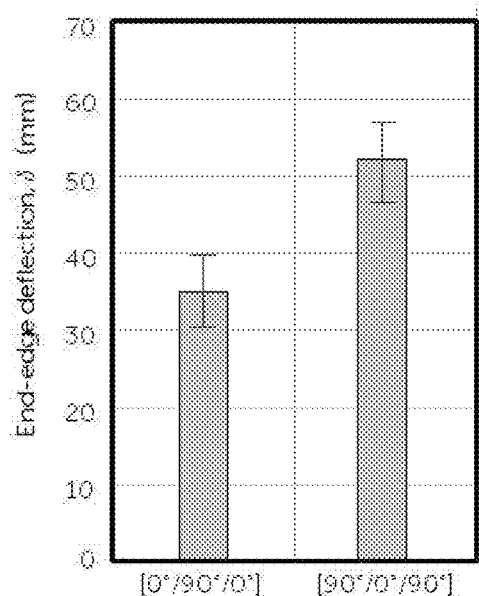

【Figure 24】
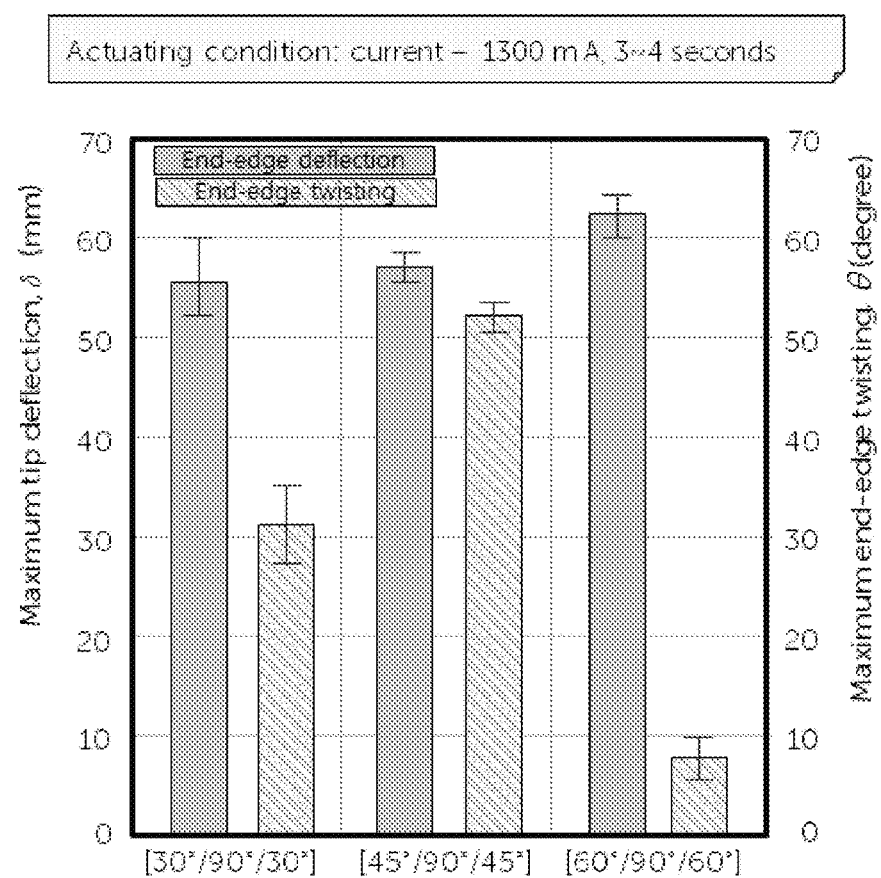

[Figure 25]
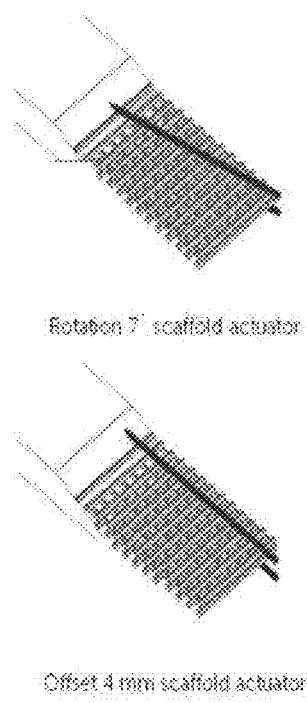
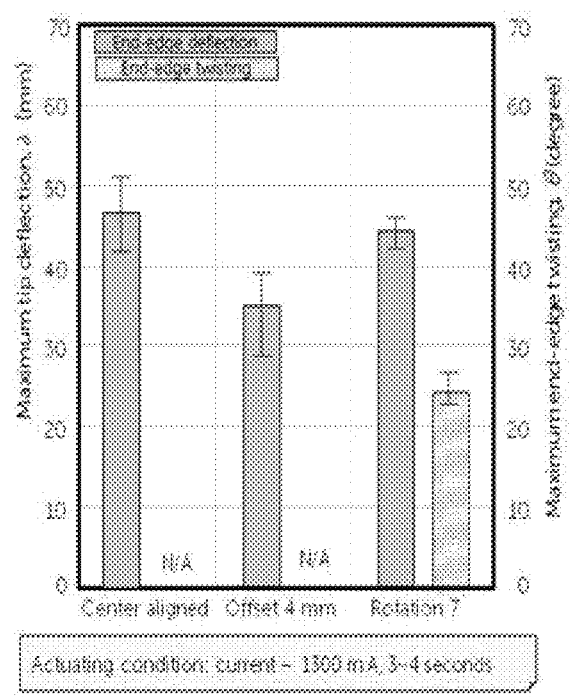

【Figure 26】
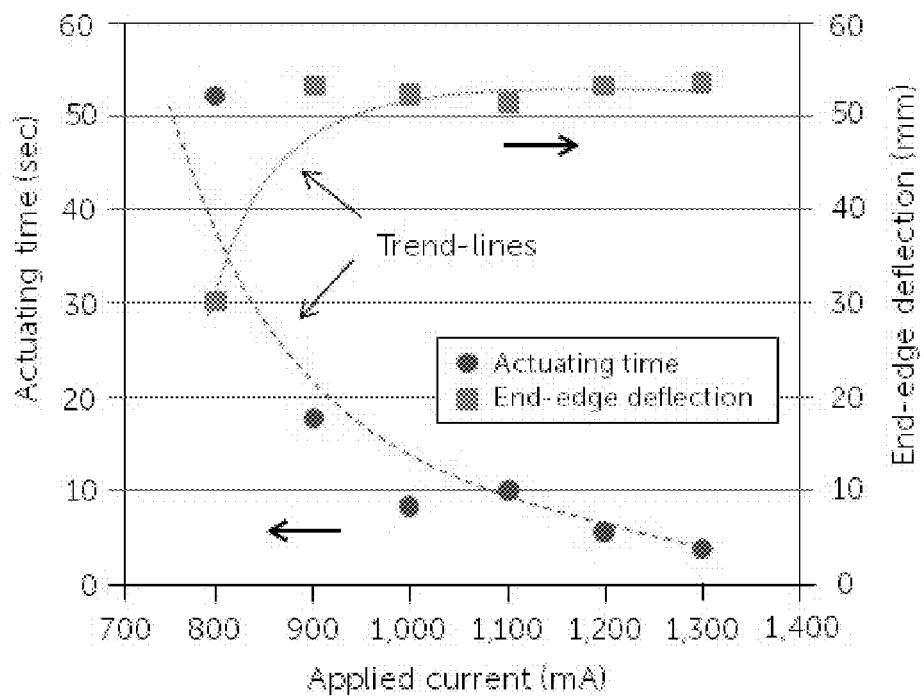

【Figure 27】
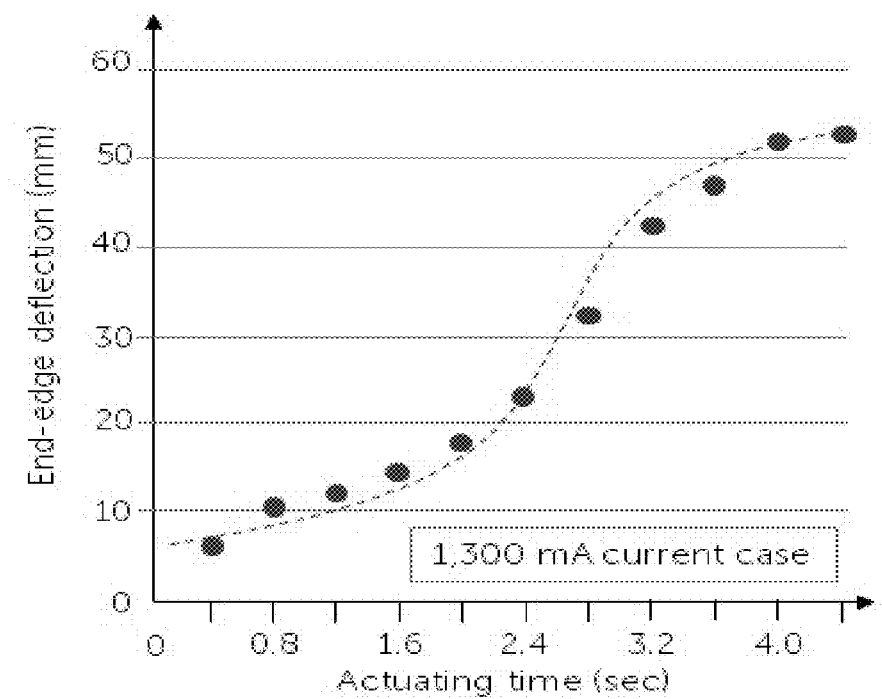

[Figure 28]
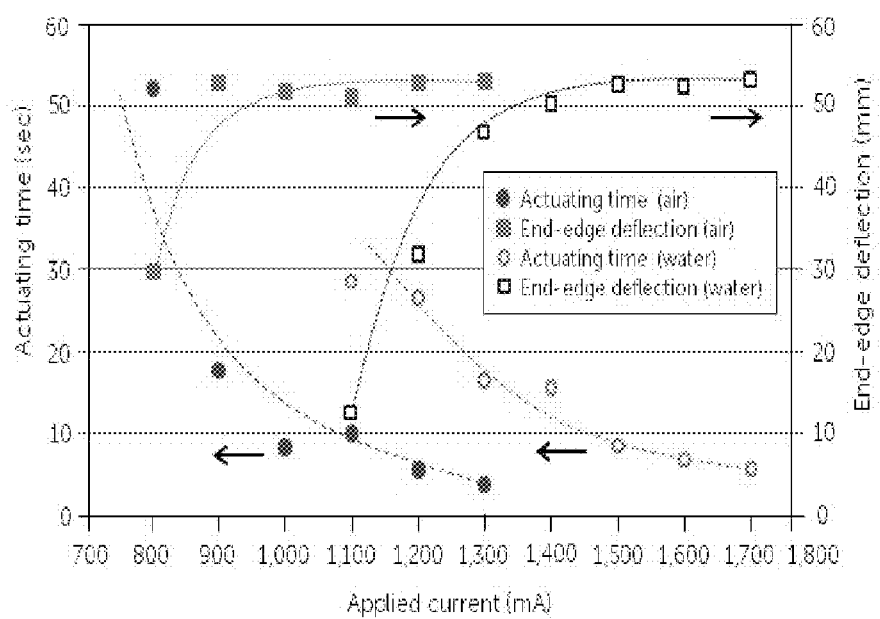
[Figure 29]
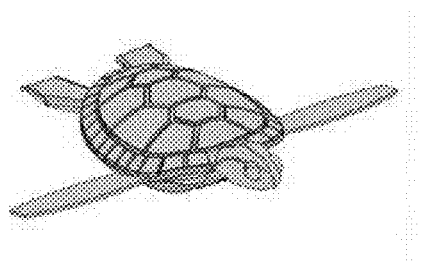

[Figure 30]
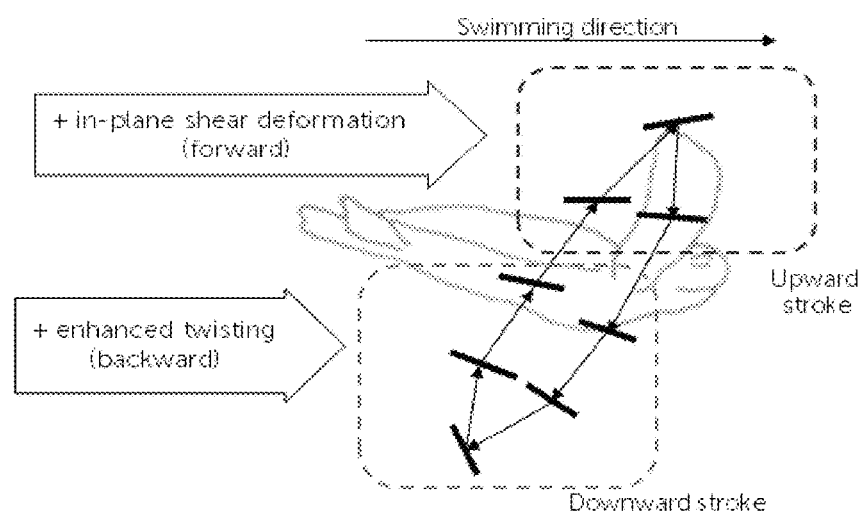
[Figure 31]
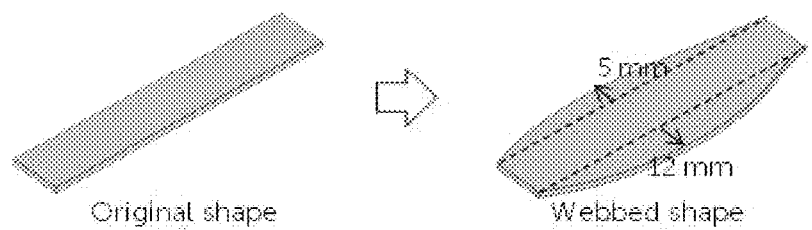

SMART SOFT COMPOSITE ACTUATOR

TECHNICAL FIELD

The present invention relates to a composite actuator prepared by mixing a smart material with a directional material and/or soft matrix.

BACKGROUND ART

Through recent studies, smart materials are widely used for various issues related with an active or passive control of structure. These materials may be shape memory alloy, piezoelectric element, electroactive polymer, and etc. These smart materials may be directly attached to the structure, or may be inserted into another material to be used as an actuator.

Roger (Craig A. Rogers, "Active vibration and structural acoustic control of shape memory alloy hybrid composites: Experimental results," The Journal of the Acoustical Society of America, Vol. 88, No. 6, pp. 2803-2811, 1990) performed an experiment for restricting vibration by preparing a shape memory alloy embedded composite, and applying an additional stress to a structure by actuating the prepared composite. Baz (A. Baz, T. Chen, and J. Ro, "Shape control of NITINOL-reinforced composite beams," Composites: Part B, Vol. 31, pp. 631-642, 2000) performed an experiment for providing a shape-changeable structure through the use of shape memory alloy embedded composite. Jung (B. S, Jung, M. S. Kim, Y. M. Kim, W. Y. Lee, and S. H. Ahn, "Fabrication of smart air intake structure using Shape Memory Alloy wire embedded composite," Physica Scripta, accepted, 2010) performed an experiment for preparing shape memory alloy embedded glass fiber composite, and developing various methods in order to improve actuating quantity. Villanueva (A. A. Villanueva, K. B. Joshi, J. B. Blottmanm, and S. Priya, "A bio-inspired shape memory alloy composite (BISMAC) actuator," Smart Materials and Structure, Vol. 19, pp. 1-17, 2010) performs an experiment for preparing various shapes of actuator through the use of shape memory alloy and room-temperature vulcanizable silicon, and measuring actuation varying based on the shape.

By studying a small-sized robot using the shape memory alloy, Kim (B. K Kim, M. G Lee, Y. P Lee, Y. I Kim and G. H Lee, "An earthworm-like micro robot using shape memory alloy actuator", Sensors and Actuators A 125 (2006) 429~437) fabricated an earthworm-like robot capable of moving forward through the use of shape memory alloy, shrinkable tube, and needle for determining a moving direction. Koh (J. S Koh and K. J Cho, "Omegabot: Biominetic Inchworm Robot using SMA Coil Actuator and Smart Composite Microstructures (SCM)", International Conference on Robotics and Biominetics, Dec. 19-23, 2009, Guilin, China) fabricated an inchworm robot, named 'Omegabot', through the use of shape memory alloy and composite prepared by SCM process. Kim (M. S. Kim, W. S. Chu, J. H. Lee, Y. M. Kim, B. S. Jung and S. H. Ahn, "Manufacturing of inchworm robot using Shape Memory Alloy (SMA) embedded composite structure," International Journal of Precision Engineering and Manufacturing, accepted, 2010) manufactured an inchworm robot capable of moving forward by providing a shape memory alloy embedded glass fiber composite with specially-prepared feet whose frictional force varies according to a moving direction.

Other smart structures may be multi-stable complex structures, and shape memory alloy composites. The multi-stable complex structures may be a bi-stable morphing airfoil proposed by Diaconu (Diaconu, C. G., Weaver, P. M., Mattioni, F., Concepts for morphing airfoil sections using bi-stable laminated composite structures, Thin-Walled Structures 46 (6), pp. 689-701, 2008), and a multi-stable morphing wing proposed by Iannucci (L. Iannucci and A. Fontanazza, Design of Morphing Wing Structures, 3rd SEAS DTC Technical Conference, Edinburgh, 2008). These multi-stable complex structures are maintained in the deformed state without additional energy. However, these multi-stable complex structures are disadvantageous in that they can be deformed only in the designed shape, that is, it is difficult to change the structures to the desired shape. The shape memory alloy composites are most generally known as the smart structure, which have been actively studied by Lagoudas et al. 1994, Kawai et al. 1999, Murasawa et al. 2004, Khalili et al. 2007a, b, Yongsheng and Shuangshuang 2007, Zhou et al. 2004, Dano and Hyer 2003, and etc. These kinds of smart structure can be controlled to be deformed in the desired shape, but it needs additional energy. The aforementioned smart structures are limited only to hard matrix. However, soft smart structures are required to realize a biomimetic technology. Ilievski (Ilievski, F., Mazzeo, A. D., Shepherd, R. F., Chen, X., Whitesides, G. M., Soft robotics for chemists, Angewandte Chemie—International Edition 50 (8), pp. 1890-1895, 2011) proposed a soft robot using soft materials of PDMS and Ecoflex.

Through recent studies, the smart materials are widely used for various problems related with the active or passive control of structure. These materials may be shape memory alloy, piezoelectric element, electroactive polymer, and etc. These smart materials may be directly attached to the structure, or may be inserted into another material to be used as an actuator. However, deformation of the structure using most of the smart material is limited to linear deformation or out-of-plane bending deformation, and the degree of deformation is too low, thereby causing the limited utilization. Also, since the actuator occupies too large space in the entire structure, it is difficult to obtain a small-sized structure.

DISCLOSURE

Technical Problem

It is an object of the present invention to provide a smart soft composite actuator which is designed to realize large deformation of user-desiring actuating (out-of-plane bending deformation, in-plane deformation, twisting, and etc.), to actuate and control the deformation, and to realize a relatively-small sized active component for actuation in the entire structure.

Technical Solution

To achieve these objects and other advantages and in accordance with the purpose of the invention, as embodied and broadly described herein, a smart soft composite actuator comprises: a smart material whose shape is changeable based on an external signal; and a matrix for supporting the smart material and determining an external shape, wherein the smart material is positioned inside the matrix or in a surface of the matrix, and at least one of in-plane shear deformation and out-of-plane deformation is realized by controlling the position of smart material.

In another aspect of the present invention, there is provided a smart soft composite actuator comprising: a smart material whose shape is changeable based on an external signal; and a directional material for supporting the smart material, determining an external shape, and restricting deformation in a specific direction, wherein the smart material is positioned inside the matrix or in a surface of the matrix, and at least one of in-plane shear deformation, out-of-plane deformation, and twisting is realized by controlling the position of smart material and directionality of directional material.

In another aspect of the present invention, there is provided a smart soft composite actuator comprising: a smart material whose shape is changeable based on an external signal; a directional material for restricting deformation in a specific direction; and a matrix for supporting the smart material and directional material, and determining an external shape, wherein the smart material is positioned inside the matrix or in a surface of the matrix, and at least one of in-plane shear deformation, out-of-plane deformation, and twisting is realized by controlling the position of smart material, position of directional material, and directionality of directional material.

Advantageous Effects

Accordingly, the present invention has the following advantages.

According to the present invention, the user-desiring deformation may be realized by changing the arrangement of smart material functioning as an active component. Also, the user-desiring deformation can be realized by changing the arrangement of smart material functioning as an active component, and the arrangement of directional material functioning as a passive component. Also, it is possible to provide a composite actuator which enables large deformation by changing the arrangement of directional material, or differently positioning the directional material and smart material. Thus, in comparison to a related art actuator, the composite actuator of the present invention enables simplified structure, easy control, and remarkably-decreased size. Also, it is possible to fabricate an actuator capable of realizing both deflection and twisting by the arrangement in direction of various directional materials.

In case of related art smart structure, it wastes large energy to maintain the deformation. Thus, according to one embodiment of the present invention, it is needed to develop a smart soft composite which is capable of maintaining the deformed shape without additional energy.

The present invention may be applied to any device whose shape is changed. For example, the present invention may be used for an airplane with a shape-changeable wing, a shape-changeable automobile, and a shape-changeable mobile phone.

DESCRIPTION OF DRAWINGS

FIGS. 1A and 1B are respectively perspective and cross sectional views of a smart soft composite actuator according to the first embodiment of the present invention.

FIGS. 2A and 2B are respectively perspective and cross sectional views of a composite actuator according to the second embodiment of the present invention.

FIGS. 3A and 3B are respectively perspective and cross sectional views of a composite actuator according to the third embodiment of the present invention.

FIGS. 4A and 4B are respectively perspective and cross sectional views of a composite actuator according to the fourth embodiment of the present invention.

FIG. 5 illustrates directional material 300 according to the various embodiments of the present invention.

FIG. 6 is a perspective view illustrating directional material 300 according to one embodiment of the present invention.

FIG. 7 is a perspective view illustrating directional material 300 according to another embodiment of the present invention.

FIGS. 8A and 8B are respectively perspective and cross sectional views of a composite actuator according to the fifth embodiment of the present invention.

FIGS. 9A and 9B are respectively perspective and cross sectional views of a composite actuator according to the sixth embodiment of the present invention.

FIGS. 10A and 10B are respectively perspective and cross sectional views of a composite actuator according to the seventh embodiment of the present invention.

FIGS. 11A and 11B are respectively perspective and cross sectional views of a composite actuator according to the eighth embodiment of the present invention.

FIGS. 12A and 12B are respectively perspective and cross sectional views of a composite actuator according to the ninth embodiment of the present invention.

FIGS. 13A and 13B are respectively perspective and cross sectional views of a composite actuator according to the tenth embodiment of the present invention.

FIGS. 14A and 14B are respectively perspective and cross sectional views of a composite actuator according to the eleventh embodiment of the present invention.

FIGS. 15A and 15B are respectively perspective and cross sectional views of a composite actuator according to the twelfth embodiment of the present invention.

FIG. 16 is a perspective view illustrating a composite actuator according to the thirteenth embodiment of the present invention.

FIG. 17 illustrates a principle of composite actuator according to the thirteenth embodiment of the present invention.

FIG. 18 is a cross sectional view illustrating a composite actuator according to the fourteenth embodiment of the present invention.

FIGS. 19 to 22 illustrate composite actuators according to various modifications of the present invention.

FIG. 23 is a graph showing deformation results in composite actuators respectively having 0°/90°/0° scaffold and 90°/0°/90° scaffold under application of 1,300 mA current.

FIG. 24 is graph and photograph showing deformation results of composite actuator having 30°/90°/30° scaffold, 45°/90°/45° scaffold, and 60°/90°/60° scaffold under application of 1,300 mA current.

FIG. 25 is a graph and photograph showing deformation results of 90°/0°/90° scaffold, SMA 4 mm offset, and 7° rotation actuators under application of 1,300 mA current.

FIG. 26 is a graph showing end-edge deflection and actuating time in accordance with an applied current of 90°/0°/90° scaffold actuator at an atmosphere of room temperature (28.1° C.).

FIG. 27 is a graph showing end-edge deflection in accordance with actuating time of 90°/0°/90° scaffold actuator at an atmosphere of room temperature (28.1° C.).

FIG. 28 is a graph showing end-edge deflection and actuating time in accordance with an applied current of 90°/0°/90° scaffold actuator at an atmosphere of room temperature (28.1° C.), and in water (24.1° C.).

FIG. 29 is a photograph and picture showing a turtle-shaped robot manufactured using a composite actuator of the present invention.

FIG. 30 illustrates a swimming principle of the turtle-shaped robot.

FIG. 31 is a photograph and picture showing results by additionally providing an angle of actuator of the turtle-shaped robot, and a webbed geometry in the turtle-shaped robot.

MODE FOR INVENTION

Hereinafter, embodiments of the present invention will be explained with the accompanying drawings.

1. First to Third Embodiments (Smart Material+Matrix)

FIGS. 1A and 1B are respectively perspective and cross sectional views of a smart soft composite actuator according to the first embodiment of the present invention.

Hereinafter, 'smart soft composite actuator' will be briefly referred to as a composite actuator.

As known from FIGS. 1A and 1B, the composite actuator according to the first embodiment of the present invention includes a smart material 100 and a matrix 200. In the composite actuator according to the first embodiment of the present invention, in-plane shear deformation may be realized.

The smart material 100 functions as an active component for realizing the in-plane shear deformation. That is, the smart material 100 may be changed in its shape according to an external signal such as a current signal. In accordance with an actuation of the smart material 100, the composite actuator according to the first embodiment of the present invention enables the in-plane shear deformation.

The smart material 100 may be shape memory alloy (SMA), piezoelectric element, ionic polymer and metal composite (IPMC), or conductive polymer (CP), but not necessarily. The smart material 100 may be formed of any material which is changed in its shape according to the external signal such as the current signal. For the following description related with embodiments of the present invention, the smart material 100 will be the same as above, and repeated explanation will be avoided therein.

The matrix 200 determines an external shape of the composite actuator according to the first embodiment of the present invention.

The matrix 200 is formed of a soft material capable of supporting the smart material 100 and also enduring large deformation of the smart material 100, wherein the smart material 100 may be positioned inside the matrix 200 or positioned in the surface of the matrix 200. In more detail, it is preferable that the matrix 200 be formed of a material whose Young's modulus is not more than 1 GPa. The matrix 200 may be formed of elastomeric polymer, silicon, or polydimethylsiloxane (PDMS), but not necessarily. For the following description related with embodiments of the present invention, the matrix 200 will be the same as above, and repeated explanation will be avoided therein.

In order to realize the in-plane shear deformation in the composite actuator including the smart material 100 and matrix 200 according to the first embodiment of the present invention, it is necessary that the smart material 100 be positioned appropriately.

In more detail, first, the smart material 100 is formed in the horizontal central plane of the matrix 200. With respect to the top and bottom of the composite actuator, in particular, the matrix 200, the smart material 100 is positioned in the center of the matrix 200.

Second, the smart material 100 is formed out of the vertical central plane of the matrix 200. That is, with respect to the left and right side of the composite actuator, in particular, the matrix 200, the smart material 100 is positioned leftward and/or rightward instead of being positioned in the center of the matrix 200. If needed, the smart material 100 may be positioned in the surface of left side and/or right side of the matrix 200.

One smart material 100 may be provided. In this case, the composite actuator may be deformed in only one direction. Thus, in order to deform the composite actuator in several directions, it is preferable that the plurality of smart materials 100 be provided at different positions. Especially, the plurality of smart materials 100 can be positioned while being symmetric with respect to a predetermined central plane. For the following description related with embodiments of the present invention, one smart material 100 may be positioned, or the plural smart materials 100 may be provided at different positions, and repeated explanation will be avoided.

Supposing that the smart material 100 satisfies the above two conditions. In this case, when the smart material 100 is deformed by the external signal, the composite actuator is deformed in the left and right side (See FIG. 1a) without being deformed in the top and bottom side with respect to the horizontal plane, to thereby realize the in-plane shear deformation.

FIGS. 2A and 2B are respectively perspective and cross sectional views of a composite actuator according to the second embodiment of the present invention.

As known from FIGS. 2A and 2B, the composite actuator according to the second embodiment of the present invention includes a smart material 100 and a matrix 200. In the composite actuator according to the second embodiment of the present invention, out-of-plane deformation may be realized.

In order to realize the out-of-plane deformation in the composite actuator including the smart material 100 and matrix 200 according to the second embodiment of the present invention, it is necessary that the smart material 100 be positioned appropriately.

In more detail, first, the smart material 100 is formed out of the horizontal central plane of the matrix 200. That is, with respect to the top and bottom of the composite actuator, in particular, the matrix 200, the smart material 100 is positioned in the upper side and/or lower side, instead of being positioned in the center of the matrix 200. If needed, the smart material 100 may be positioned in the upper surface and/or lower surface of the matrix 200.

Second, the smart material 100 is formed in the vertical central plane of the matrix 200. That is, with respect to the left and right side of the composite actuator, in particular, the matrix 200, the smart material 100 is positioned in the center of the matrix 200.

Supposing that the smart material 100 satisfies the above two conditions. In this case, when the smart material 100 is deformed by the external signal, the composite actuator is deformed in the top and bottom side (See FIG. 2a) without being deformed in the left and right side with respect to the horizontal plane, to thereby realize the out-of-plane deformation.

FIGS. 3A and 3B are respectively perspective and cross sectional views of a composite actuator according to the third embodiment of the present invention.

As known from FIGS. 3A and 3B, the composite actuator according to the third embodiment of the present invention includes a smart material 100 and a matrix 200. In the composite actuator according to the third embodiment of the present invention, both in-plane shear deformation and out-of-plane deformation may be realized.

In order to realize the in-plane shear deformation and out-of-plane deformation in the composite actuator including the smart material 100 and matrix 200 according to the third embodiment of the present invention, it is necessary that the smart material 100 be positioned appropriately.

In more detail, first, the smart material 100 is formed out of the horizontal central plane of the matrix 200. That is, with respect to the top and bottom of the composite actuator, in particular, the matrix 200, the smart material 100 is positioned in the upper side and/or lower side, instead of being positioned in the center of the matrix 200. If needed, the smart material 100 may be positioned in the upper surface and/or lower surface of the matrix 200.

Second, the smart material 100 is formed out of the vertical central plane of the matrix 200. That is, with respect to the left and right side of the composite actuator, in particular, the matrix 200, the smart material 100 is positioned leftward and/or rightward, instead of being positioned in the center of the matrix 200. If needed, the smart material 100 may be positioned in the surface of left side and/or right side of the matrix 200.

Supposing that the smart material 100 satisfies the above two conditions. In this case, when the smart material 100 is deformed by the external signal, the composite actuator is deformed in not only top and bottom side but also left and right side, to thereby realize the in-plane shear deformation and the out-of-plane deformation.

2. Fourth to Sixth Embodiments (Smart Material+Directional Material)

FIGS. 4A and 4B are respectively perspective and cross sectional views of a smart soft composite actuator according to the fourth embodiment of the present invention.

As known from FIGS. 4A and 4B, the composite actuator according to the fourth embodiment of the present invention includes a smart material 100 and a directional material 300. In the composite actuator according to the fourth embodiment of the present invention, out-of-plane deformation may be realized.

The directional material 300 determines an external shape of the composite actuator according to the fourth embodiment of the present invention. The directional material 300 may be formed of a scaffold for supporting the smart material 100, wherein the smart material 100 may be positioned inside the direction material 300 or positioned in the surface of the directional material 300.

The directional material 300 functions as a passive component for restricting deformation in a specific direction. Thus, if the smart material 100 functioning as the active component for inducing deformation in a specific direction is harmoniously combined with the directional material 300 functioning as the passive component for restricting deformation in a specific direction, as shown in the fourth to sixth embodiments of the present invention, it is possible to realize various modifications of the composite actuator.

The directional material 300 is formed of a stiff material so as to function as the passive component. Especially, it is preferable that the directional material 300 be formed of a material whose Young's modulus is not less than 1 GPa.

The directional material 300 having the above properties may be prepared by weaving process of fiber, rapid prototyping process, or injection process. The prepared directional material 300 may be in a mesh structure, but not necessarily. The directional material 300 may be formed of various kinds of well-known fiber or ABS (acrylonitrile butadiene styrene copolymer).

FIG. 5 illustrates the directional material 300 according to the various embodiments of the present invention.

As known from FIG. 5(a), the directional material 300 may be prepared by the rapid prototyping process. That is, when molten thermoplastic polymer is deposited through the use of nozzle, a precise stage having three or more shafts is used so that the directional material 300 having the various directionalities is prepared.

As known from FIGS. 5(b) and 5(c), the directional material 300 may be prepared having a specific directionality, which may be prepared by the injection process.

The directional material 300 may include a directional material layer which is aligned in a specific direction, or may includes a plurality of directional material layers which are aligned in different directions. For example, if using the rapid prototyping process shown in FIG. 5(a), it is possible to obtain the plurality of directional material layers aligned in different directions with easiness. Also, the plurality of directional material layers aligned in different directions may be obtained by a multiple layers of the directional material shown in FIGS. 5(b) and 5(c).

For the following description related with embodiments of the present invention, the directional material 300 and the preparing method are the same as above, and a repeated description will be avoided.

In the composite actuator according to the fourth embodiment of the present invention, the out-of-plane deformation may be realized. For this, it is necessary that the smart material 100 be positioned appropriately, and the directionality of directional material 300 be set properly.

The position of the smart material 100 will be explained as follows.

First, the smart material 100 is formed out of the horizontal central plane of the directional material 300. That is, with respect to the top and bottom of the composite actuator, in particular, the directional material 300, the smart material 100 is positioned in the upper side and/or lower side, instead of being positioned in the center of the directional material 300. If needed, the smart material 100 may be positioned in the upper surface and/or lower surface of the directional material 300.

Second, the smart material 100 is formed in the vertical central plane of the directional material 300. That is, with respect to the left and right side of the composite actuator, in particular, the directional material 300, the smart material 100 is positioned in the center of the directional material 300.

When the smart material 100 satisfies the above two conditions, the smart material 100 is deformed in the top and bottom side with respect to the horizontal plane by the external signal, without being deformed in the left and right side.

Then, directionality of the directional material 300 will be explained as follows.

The directional material 300 is formed having specially orthotropic properties. As the directional material 300 has the specially orthotropic properties, the smart material 100 is deformed by the external signal. That is, when the smart material 100 is deformed in the top and bottom side with respect to the horizontal plane, deformation is not changed by the directional material 300, to thereby realize the out-of-plane deformation.

In other words, the directional material 300 functions as the passive component for deformation, thereby making it possible to restrict and change a deformation. According to the fourth embodiment of the present invention, deformation is not changed. For this, the directional material 300 is formed having the specially orthotropic properties.

Examples of the directional material 300 having the specially orthotropic properties will be shown in FIGS. 6 and 7.

FIG. 6 is a perspective view illustrating the directional material 300 according to one embodiment of the present invention. FIG. 7 is a perspective view illustrating the directional material 300 according to another embodiment of the present invention.

Referring to FIG. 6, the directional material 300 according to one embodiment of the present invention includes a first directional material layer 310 aligned in the angle of 0°, and a second directional material layer 320 aligned in the angle of 90°.

Referring to FIG. 7, the directional material 300 according to another embodiment of the present invention includes a first directional material layer 310 aligned in the angle of 45°, and a second directional material layer 320 aligned in the angle of 135°.

As shown in FIGS. 6 and 7, the directional material 300 includes the first and second directional material layers 310 and 320 which are orthogonal to each other, whereby offset for the directionality is achieved, and also the deformation of the smart material 100 is not changed.

FIGS. 8a and 8b are respectively perspective and cross sectional views of a composite actuator according to the fifth embodiment of the present invention.

As known from FIGS. 8a and 8b, the composite actuator according to the fifth embodiment of the present invention includes a smart material 100 and a directional material 300. In the composite actuator according to the fifth embodiment of the present invention, out-of-plane deformation and twisting may be realized.

In order to realize the out-of-plane deformation and twisting in the composite actuator according to the fifth embodiment of the present invention, it is necessary to appropriately position the smart material 100, and also to appropriately set the directionality of the directional material 300.

The position of the smart material 100 will be explained as follows.

First, the smart material 100 is formed out of the horizontal central plane of the directional material 300. That is, with respect to the top and bottom of the composite actuator, in particular, the directional material 300, the smart material 100 is positioned in the upper side and/or lower side, instead of being positioned in the center of the directional material 300. If needed, the smart material 100 may be positioned in the upper surface and/or lower surface of the directional material 300.

Second, the smart material 100 is formed in the vertical central plane of the directional material 300. That is, with respect to the left and right side of the composite actuator, in particular, the directional material 300, the smart material 100 is positioned in the center of the directional material 300.

When the smart material 100 satisfies the above two conditions, the smart material 100 is deformed not in the left and right side but in the top and bottom side with respect to the horizontal plane, in response to the external signal, to thereby realize the out-of-plane deformation in the composite actuator.

Then, directionality of the directional material 300 will be explained as follows.

The directional material 300 is formed having anisotropic properties instead of the specially orthotropic properties. That is, the directional material 300 is formed in such a manner that stiffness in a specific direction is greater than stiffness in other directions.

In case that the directional material 300 has the anisotropic properties, when the smart material 100 is deformed by the external signal, twisting occurs with respect to the direction having the greater stiffness in the directional material 300.

That is, the directional material 300 functions as the passive component for restricting and changing deformation, whereby both out-of-plane deformation and twisting are simultaneously realized by combination of the smart material 100 and the directional material 300.

The directional material 300 having the anisotropic properties may be formed of a plurality of directional material layers which are not orthogonal to each other.

FIGS. 9A and 9B are respectively perspective and cross sectional views of a composite actuator according to the sixth embodiment of the present invention.

As known from FIGS. 9A and 9B, the composite actuator according to the sixth embodiment of the present invention includes a smart material 100 and a directional material 300. In the composite actuator according to the sixth embodiment of the present invention, out-of-plane deformation and in-plane shear deformation may be realized.

In the composite actuator according to the sixth embodiment of the present invention, both the out-of-plane deformation and in-plane shear deformation may be realized. For this, it is necessary to appropriately position the smart material 100, and also to appropriately set the directionality of the directional material 300.

The position of the smart material 100 will be explained as follows.

First, the smart material 100 is formed out of the horizontal central plane of the directional material 300. That is, with respect to the top and bottom of the composite actuator, in particular, the directional material 300, the smart material 100 is positioned in the upper side and/or lower side, instead of being positioned in the center of the directional material 300. If needed, the smart material 100 may be positioned in the upper surface and/or lower surface of the directional material 300.

Second, the smart material 100 is formed out of the vertical central plane of the directional material 300. That is, with respect to the left and right side of the composite actuator, in particular, the directional material 300, the smart material 100 is positioned leftward and/or rightward instead of being positioned in the center of the directional material 300. If needed, the smart material 100 may be positioned in the surface of left side and/or right side of the directional material 300.

Then, directionality of the directional material 300 will be explained as follows.

The directional material 300 is formed having specially orthotropic properties. As the directional material 300 has the specially orthotropic properties, the smart material 100 is deformed by the external signal. That is, when the smart material 100 is deformed in not only top and bottom side but also left and right side, the deformation is not changed by the directional material 300 to thereby realize the out-of-plane deformation and in-plane shear deformation in the composite actuator.

The directional material 300 having the specially orthotropic properties may include first and second directional material layers 310 and 310 which are orthogonal to each other, as described in the above explanation of FIGS. 6 and 7, which may be similarly applied to the following embodiments.

3. Seventh to Thirteenth Embodiments (Smart Material+Matrix+Directional Material)

FIGS. 10A and 10B are respectively perspective and cross sectional views of a composite actuator according to the seventh embodiment of the present invention.

As known from FIGS. 10A and 10B, the composite actuator according to the seventh embodiment of the present invention includes a smart material 100, a matrix 200, and a directional material 300. In the composite actuator according to the seventh embodiment of the present invention, in-plane shear deformation may be realized.

In the seventh to twelfth embodiments of the present invention, each composite actuator is formed by combining the smart material 100, the matrix 200, and the directional material 300; and an external shape of the composite actuator is determined by the matrix 200. Thus, the smart material 100 and directional material 300 are positioned inside the matrix 200 or positioned in the surface of the matrix 200.

If the directional material 300 is formed in a mesh structure, openings of the mesh structure may be filled up with the matrix 200, but not necessarily.

In the composite actuator according to the seventh embodiment of the present invention, in-plane shear deformation may be realized. For this, it is necessary to appropriately position the smart material 100, and also to appropriately set the directionality and position of the directional material 300.

The position of the smart material 100 will be explained as follows.

First, the smart material 100 is formed in the horizontal central plane of the matrix 200. That is, with respect to the top and bottom of the composite actuator, in particular, the matrix 200, the smart material 100 is positioned in the center of the matrix 200.

Second, the smart material 100 is formed out of the vertical central plane of the matrix 200. That is, with respect to the top and bottom of the composite actuator, in particular, the matrix 200, the smart material 100 is positioned leftward and/or rightward instead of being positioned in the center of the matrix 200. If needed, the smart material 100 may be positioned in the surface of left side and/or right side of the matrix 200.

Then, directionality and position of the directional material 300 will be explained as follows.

The directional material 300 is formed having specially orthotropic properties.

The directional material 300 may be formed by combining a first directional material layer 310 and a second directional material layer 320. In this case, the first and second directional material layers 310 and 320 are symmetrically positioned while being opposite to each other with respect to the horizontal central plane of the matrix 200.

The first and second directional material layers 310 and 320 are provided in such a manner that they are orthogonal to each other, whereby the directional material 300 formed by combining the first and second directional material layers 310 and 320 may have the orthogonal anisotropic properties.

However, it is not limited to the above description. Each of the first and second directional material layers 310 may include a plurality of directional material layers, to thereby realize the orthogonal anisotropic properties.

Owing to the above structure, when the smart material 100 is deformed by the external signal, that is, when the smart material 100 is deformed in the left and right side with respect to the horizontal plane, there is no change on the deformation. Eventually, the in-plane shear deformation may be realized in the composite actuator.

FIGS. 11A and 11B are respectively perspective and cross sectional views of a composite actuator according to the eighth embodiment of the present invention.

As known from FIGS. 11A and 11B, the composite actuator according to the eighth embodiment of the present invention includes a smart material 100, a matrix 200, and a directional material 300. In the composite actuator according to the eighth embodiment of the present invention, out-of-plane deformation may be realized.

In the composite actuator according to the eighth embodiment of the present invention, out-of-plane deformation may be realized. For this, it is necessary to appropriately position the smart material 100, and also to appropriately set the directionality and position of the directional material 300.

The position of the smart material 100 will be explained as follows.

First, the smart material 100 is formed out of the horizontal central plane of the matrix 200. That is, with respect to the top and bottom of the composite actuator, in particular, the matrix 200, the smart material 100 is positioned in the upper side and/or lower side, instead of being positioned in the center of the directional material 300. If needed, the smart material 100 may be positioned in the upper surface and/or lower surface of the matrix 200.

Second, the smart material 100 is formed in the vertical central plane of the matrix 200. That is, with respect to the left and right side of the composite actuator, in particular, the matrix 200, the smart material 100 is positioned in the center of the matrix 200.

Then, the directionality and position of the directional material 300 will be explained as follows.

The directional material 300 is formed having specially orthotropic properties. Also, the directional material 300 is formed in the horizontal central plane of the matrix 200.

Owing to the above structure, when the smart material 100 is deformed by the external signal, that is, when the smart material 100 is deformed in the top and bottom side with respect to the horizontal plane, there is no change on the deformation. Eventually, the out-of-plane deformation may be realized in the composite actuator.

FIGS. 12A and 12B are respectively perspective and cross sectional views of a composite actuator according to the ninth embodiment of the present invention.

As known from FIGS. 12A and 12B, the composite actuator according to the ninth embodiment of the present invention includes a smart material 100, a matrix 200, and a directional material 300. In the composite actuator according to the ninth embodiment of the present invention, twisting may be realized.

In the composite actuator according to the ninth embodiment of the present invention, twisting may be realized. For this, it is necessary to appropriately position the smart material 100, and also to appropriately set the directionality and position of the directional material 300.

The position of the smart material 100 will be explained as follows.

First, the smart material 100 is formed in the horizontal central plane of the matrix 200. That is, with respect to the top and bottom of the composite actuator, in particular, the matrix 200, the smart material 100 is positioned in the center of the directional material 300.

Second, the smart material 100 is formed in the vertical central plane of the matrix 200. That is, with respect to the left and right side of the composite actuator, in particular, the matrix 200, the smart material 100 is positioned in the center of the matrix 200.

Then, directionality and position of the directional material 300 will be explained as follows.

The directional material 300 is formed having anisotropic properties instead of the specially orthotropic properties. That is, the directional material 300 is formed in such a manner that stiffness in a specific direction is greater than stiffness in other directions.

In case that the directional material 300 has the anisotropic properties, when the smart material 100 is deformed by the external signal, twisting occurs with respect to the direction having the greater stiffness in the directional material 300.

The directional material 300 may be formed by combining a first directional material layer 310 and a second directional material layer 320. In this case, the first and second directional material layers 310 and 320 are symmetrically positioned while being opposite to each other with respect to the horizontal central plane.

FIGS. 13A and 13B are respectively perspective and cross sectional views of a composite actuator according to the tenth embodiment of the present invention.

As known from FIGS. 13A and 13B, the composite actuator according to the tenth embodiment of the present invention includes a smart material 100, a matrix 200, and a directional material 300. In the composite actuator according to the tenth embodiment of the present invention, out-of-plane deformation and in-plane shear deformation may be realized.

In the composite actuator according to the tenth embodiment of the present invention, both the out-of-plane deformation and in-plane shear deformation may be realized. For this, it is necessary to appropriately position the smart material 100, and also to appropriately set the directionality and position of the directional material 300.

The position of the smart material 100 will be explained as follows.

First, the smart material 100 is formed out of the horizontal central plane of the matrix 200. That is, with respect to the top and bottom of the composite actuator, in particular, the matrix 200, the smart material 100 is positioned in the upper side and/or lower side, instead of being positioned in the center of the directional material 300. If needed, the smart material 100 may be positioned in the upper surface and/or lower surface of the matrix 200.

Second, the smart material 100 is formed out of the vertical central plane of the matrix 200. That is, with respect to the left and right side of the composite actuator, in particular, the matrix 200, the smart material 100 is positioned leftward and/or rightward instead of being positioned in the center of the matrix 200. If needed, the smart material 100 may be positioned in the surface of left side and/or right side of the matrix 200.

Then, directionality and position of the directional material 300 will be explained as follows.

The directional material 300 is formed having specially orthotropic properties. Also, the directional material 300 is formed in the horizontal central plane of the matrix 200.

Owing to the above structure, when the smart material 100 is deformed by the external signal, that is, when the smart material 100 is deformed in not only top and bottom side but also left and right side with respect to the horizontal plane, the deformation is not changed to thereby realize the out-of-plane deformation and in-plane shear deformation in the composite actuator.

FIGS. 14A and 14B are respectively perspective and cross sectional views of a composite actuator according to the eleventh embodiment of the present invention.

As known from FIGS. 14A and 14B, the composite actuator according to the eleventh embodiment of the present invention includes a smart material 100, a matrix 200, and a directional material 300. In the composite actuator according to the eleventh embodiment of the present invention, out-of-plane deformation and twisting may be realized.

In the composite actuator according to the eleventh embodiment of the present invention, both the out-of-plane deformation and twisting may be realized. For this, it is necessary to appropriately position the smart material 100, and also to appropriately set the directionality and position of the directional material 300.

The position of the smart material 100 will be explained as follows.

First, the smart material 100 is formed out of the horizontal central plane of the matrix 200. That is, with respect to the top and bottom of the composite actuator, in particular, the matrix 200, the smart material 100 is positioned in the upper side and/or lower side, instead of being positioned in the center of the directional material 300. If needed, the smart material 100 may be positioned in the upper surface and/or lower surface of the matrix 200.

Second, the smart material 100 is formed in the vertical central plane of the matrix 200. That is, with respect to the left and right side of the composite actuator, in particular, the matrix 200, the smart material 100 is positioned in the center of the matrix 200.

Then, directionality and position of the directional material 300 will be explained as follows.

The directional material 300 is formed having anisotropic properties instead of the specially orthotropic properties. That is, the directional material 300 is formed in such a manner that stiffness in a specific direction is greater than stiffness in other directions.

In case that the directional material 300 has the anisotropic properties, when the smart material 100 is deformed by the external signal, twisting occurs with respect to the direction having the greater stiffness in the directional material 300.

The directional material 300 can be formed in the horizontal central plane of the matrix 200.

Owing to the above structure, when the smart material 100 is deformed by the external signal, the out-of-plane deformation may be realized in the composite actuator, and simultaneously the twisting may be realized by the directional material 300 having the anisotropic properties.

FIGS. 15A and 15B are respectively perspective and cross sectional views of a composite actuator according to the twelfth embodiment of the present invention.

As known from FIGS. 15A and 15B, the composite actuator according to the twelfth embodiment of the present invention includes a smart material 100, a matrix 200, and a directional material 300. In the composite actuator according to the twelfth embodiment of the present invention, out-of-plane deformation, in-plane shear deformation, and twisting may be realized.

In the composite actuator according to the twelfth embodiment of the present invention, the out-of-plane deformation, in-plane shear deformation, and twisting may be realized. For this, it is necessary to appropriately position the smart material 100, and also to appropriately set the directionality and position of the directional material 300.

The position of the smart material 100 will be explained as follows.

First, the smart material 100 is formed out of the horizontal central plane of the matrix 200. That is, with respect to the top and bottom of the composite actuator, in particular, the matrix 200, the smart material 100 is positioned in the upper side and/or lower side, instead of being positioned in the center of the directional material 300. If needed, the smart material 100 may be positioned in the upper surface and/or lower surface of the matrix 200.

Second, the smart material 100 is formed out of the vertical central plane of the matrix 200. That is, with respect to the left and right side of the composite actuator, in particular, the matrix 200, the smart material 100 is positioned leftward and/or rightward instead of being positioned in the center of the matrix 200. If needed, the smart material 100 may be positioned in the surface of left side and/or right side of the matrix 200.

Then, directionality and position of the directional material 300 will be explained as follows.

The directional material 300 is formed having anisotropic properties instead of the specially orthotropic properties. That is, the directional material 300 is formed in such a manner that stiffness in a specific direction is greater than stiffness in other directions.

In case that the directional material 300 has the anisotropic properties, when the smart material 100 is deformed by the external signal, twisting occurs with respect to the direction having the greater stiffness in the directional material 300.

The directional material 300 can be formed in the horizontal central plane of the matrix 200.

Owing to the above structure, when the smart material 100 is deformed by the external signal, the smart material 100 is deformed in not only top and bottom side but also left and right side with respect to the horizontal plane. Thus, the out-of-plane deformation and in-plane shear deformation may be realized in the composite actuator, and simultaneously the twisting may be realized by the directional material 300 having the anisotropic properties.

4. Other Embodiments

FIG. 16 is a perspective view illustrating a composite actuator according to the thirteenth embodiment of the present invention.

As shown in FIG. 16, the composite actuator according to the thirteenth embodiment of the present invention includes a smart material 100, a matrix 200, and a directional material 300.

According to the aforementioned seventh to twelfth embodiments of the present invention, the smart material 100 and the directional material 300 included in the matrix 200 have different levels. However, in case of the thirteenth embodiment of the present invention, the smart material 100 and the directional material 300 included in the matrix 200 have the same level.

In the thirteenth embodiment of the present invention, a fabric structure is made by the warp and weft, wherein the warp is formed of any one of the smart material 100 and the directional material 300, and the weft is formed of the other of the smart material 100 and the directional material 300.

In case that the fabric structure is formed with the smart material 100 and the directional material 300, even though the external signal is blocked after the deformation of the smart material 100, owing to a frictional force between the smart material 100 and the directional material 300, the smart material 100 is maintained in the deformed state without being restored to its original state.

Typically, the composite actuator is deformed when the external signal is applied thereto, and the deformed state is restored to its original state when the external signal is blocked. However, in case of the thirteenth embodiment of the present invention, the deformed state of the composite actuator is maintained even though the external signal is blocked, which enables the decrease of energy consumption for maintaining the deformed state of the composite actuator.

The directionality of directional material 300 applied to the thirteenth embodiment of the present invention may be appropriately changed based on the shape to be realized in the composite actuator.

FIG. 17 illustrates a principle of composite actuator according to the thirteenth embodiment of the present invention. In FIG. 17, 'SMA' is a smart material; and 'Fiber' is a directional material.

The fabric structure for the composite actuator according to the thirteenth embodiment of the present invention has two phase changes, wherein one is the phase change of smart material (SMA), and the other is the phase change of matrix (Matrix).

As shown in a left image of FIG. 17, there is an example showing that three smart materials are included. When a current flows in the central smart material, out-of-plane deformation is realized by eccentricity of upper and lower matrix, whereby pure bending deformation occurs. When a current flows in the side smart material, an in-plane deformation occurs.

When a current flows in the right smart material, as shown in a right image, a temperature rises so that the first phase change corresponding to the phase change of the smart material occurs. Simultaneously, a glass transition temperature (Tg) of the matrix is lower than an austenite finish temperature of the smart material, whereby the second phase change occurs. Thus, a heat affected zone (HAZ) occurs between the smart material and the matrix. In this heat affected zone (HAZ), the shear modulus of matrix rapidly falls from E2 to E1, thereby obtaining high expansion.

The smart material having the phase change shrinks. In this case, owing to a frictional force caused by cohesion between the directional material and the matrix, a large deformation occurs in the matrix having high expansion of the heat affected zone (HAZ). When finishing actuating, that is, blocking the current flow, the smart material is cooled, and the phase change occurs again, whereby the shear modulus of matrix gets back to E2. When the directional material and the matrix cohere completely, the smart material is fixed while being restored to the original state.

Entirely, the in-plane shear deformation occurs in the composite actuator by eccentricity of left and right matrix. Even after finishing actuating, the deformed state is not restored to the original state, completely. Similarly, the same mechanism is applied to actuating of the left smart material.

If the central smart material is actuated together with one of the side smart material, twisting occurs.

FIG. 18 is a cross sectional view illustrating a composite actuator according to the fourteenth embodiment of the present invention.

As shown in FIG. 18, the composite actuator according to the fourteenth embodiment of the present invention includes a smart material 100, a matrix 200, and a directional material 300.

In the composite actuator according to the fourteenth embodiment of the present invention, the directional material 300 is formed in a bent structure at a specific region (H), whereby it is possible to realize deformation of the composite actuator with easiness.

That is, when the smart material 100 is deformed by the external signal, for example, when it is shrink-deformed, the specific region (H) with relatively low stiffness may function as a hinge structure, whereby the composite actuator may be easily bent to an arrow direction.

According to the fourteenth embodiment of the present invention, the directional material 300 is formed in the bent structure, thereby making an inner space. Thus, external components 400 may be additionally provided in the inner space prepared by the bent structure of the directional material 300. Even though the external components 400 have large stiffness, the composite actuator may be easily deformed by the hinge structure.

The matrix 200 supports the smart material 100 and the directional material 300. The smart material 100 can be positioned under or over the directional material 300.

FIGS. 19 to 22 illustrate composite actuators according to various modifications of the present invention, which will be explained briefly.

As shown in FIG. 19, a bottom layer is prepared by inserting a smart material 100 into a directional material 300 of a fabric structure. Thereon, there are first and second directional materials 310 and 320, a smart material 100 and a matrix 200.

As shown in FIG. 20, smart materials are positioned at the top and bottom, and first to fourth direction material layers having different directionalities are interposed therebetween. The smart material and directional material layers are supported by a matrix. In the composite actuator shown in FIG. 20, out-of-plane deformation and twisting may be realized. In FIG. 20, 'passive component' is the directional material.

As shown in FIG. 21, smart materials are positioned at the top and bottom, and various direction material layers having different directionalities are interposed therebetween. The smart material and directional material layers are supported by a matrix. In the composite actuator shown in FIG. 21, out-of-plane deformation and twisting may be realized. In FIG. 21, 'fiber phase' is the directional material.

As shown in FIG. 22, smart materials are positioned on lower and upper surfaces of a directional material, and the directional material is formed of multi-directional material layers having different directionalities. The smart material and directional material layers are supported by a matrix. In FIG. 22, 'SMA wires' is the smart material, and 'scaffold' is the directional material.

5. Experimental Examples

FIG. 23 is a graph showing deformation results in composite actuators respectively having 0°/90°/0° scaffold and 90°/0°/90° scaffold under application of 1,300 mA current.

As shown in FIG. 23, it is known that displacement of the out-of-plane deformation having no twisting can be changed through the use of 0°/90°/0° scaffold and 90°/0°/90° scaffold. In this case, if the layer of 0° scaffold having high stiffness is provided as the external layer, the maximum end-edge deflection is less. From this, it is possible to know that the deflection stiffness of actuator is affected by the scaffold, and the high deflection stiffness is induced when the scaffold having high stiffness is positioned adjacent to the external.

FIG. 24 is graph and photograph showing deformation results of composite actuator having 30°/90°/30° scaffold, 45°/90°/45° scaffold, and 60°/90°/60° scaffold under application of 1,300 mA current.

As shown in FIG. 24, twisting occurring with the out-of-plane deformation becomes different through the use of 30°/90°/30° scaffold, 45°/90°/45° scaffold, and 60°/90°/60° scaffold. When an angle of the external layer is changed under the center layer of the scaffold is constantly fixed, the twisting occurs differently. Especially, with respect to 45°, the twisting at 30° close to 0° is larger than the twisting at 60° close to 90°. Thus, it can be known that an inclination of the twisting is controlled.

FIG. 25 is a graph and photograph showing deformation results of 90°/0°/90° scaffold, SMA 4 mm offset, and 7° rotation actuators under application of 1,300 mA current.

As shown in FIG. 25, the in-plane shear deformation and twisting are induced by using 90°/0°/90° scaffold and changing SMA placement. When the SMA placement is provided at a predetermined interval from the central axis, the in-plane shear deformation occurs. Also, when the SMA placement is tilted at an angle of 7° with respect to the central axis, the twisting may occur in the 90°/0°/90° scaffold which had no twisting. This shows that the deformation of actuator is affected by not only the structure of scaffold but also the SMA structure, whereby it is possible to intentionally control the deformation by design.

FIG. 26 is a graph showing end-edge deflection and actuating time in accordance with an applied current of 90°/0°/90° scaffold actuator at an atmosphere of room temperature (28.1° C.).

As shown in FIG. 26, according as a value of applied current increases, the actuating time becomes shorter, and the end-edge deflection is convergent to the maximum deformation of actuator. Also, according to the increase of applied current value, a ratio of heat emitted to the external of actuator is decreased so that the actuating time is decreased non-linearly. Similarly, the end-edge deflection is increased non-linearly.

FIG. 27 is a graph showing end-edge deflection in accordance with actuating time of 90°/0°/90° scaffold actuator at an atmosphere of room temperature (28.1° C.).

As shown in FIG. 27, when comparing the end-edge deflection by each actuating time, it is known that the actuation is non-linear. The rapid deformation occurs in the central part for the entire actuating time. Eventually, a curvature radius in the large deformation occurring in this embodiment of the present invention is about 34~74 mm.

FIG. 28 is a graph showing end-edge deflection and actuating time in accordance with an applied current of 90°/0°/90° scaffold actuator at an atmosphere of room temperature (28.1° C.), and in water (24.1° C.).

As shown in FIG. 28, the actuating in water consumes more energy than the actuating at the atmosphere. When the same current is applied, the actuating time in water is remarkably slower than the actuating time at the atmosphere. However, if the applied current is increased by a predetermined level (400 mA) on the experimental conditions, the actuating in water is very similar to the actuating at the atmosphere.

FIG. 29 is a photograph and picture showing a turtle-shaped robot manufactured using a composite actuator of the present invention, FIG. 30 illustrates a swimming principle of the turtle-shaped robot, and FIG. 31 is a photograph and picture showing results by additionally providing an angle of actuator of the turtle-shaped robot, and a webbed geometry in the turtle-shaped robot.

As shown in FIG. 30, the out-of-plane deformation and twisting may be realized in the turtle-shaped robot. As shown in FIG. 31, in order to maximize the swimming effect by the out-of-plane deformation and twisting, an angle of actuator and a webbed geometry may be additionally provided.

The invention claimed is:

1. A smart soft composite actuator comprising:
a first smart material and a separate second smart material whose shapes are changeable based on an external signal; and
a matrix configured to support the first and second smart materials and determine an external shape of the smart soft composite actuator,
wherein the first and second smart materials are inside the matrix or in a surface of the matrix,
the first smart material is completely on one side of a central plane of the matrix, and the second smart material is completely on an opposite side of the central plane of the matrix, spaced apart from the first smart material, and
at least one of in-plane shear deformation and out-of-plane deformation is realized by controlling positions of the first and second smart materials.

2. The actuator of claim 1, wherein the first and second smart materials are in a horizontal central plane of the matrix, but completely outside of a vertical central plane of the matrix to realize the in-plane shear deformation.

3. The actuator of claim 1, wherein the first and second smart materials are completely outside of a horizontal central plane of the matrix, but in a vertical central plane of the matrix to realize the out-of-plane deformation.

4. The method of claim 1, wherein the first and second smart materials are completely outside of a horizontal central plane of the matrix and completely outside of a vertical central plane of the matrix to realize the in-plane shear deformation and out-of-plane deformation.

5. A smart soft composite actuator comprising:
a first smart material and a separate second smart material whose shapes are changeable based on an external signal; and
a directional material configured to support the first and second smart materials, determine an external shape of the smart soft composite actuator, and restrict deformation of the smart soft composite actuator in a specific direction,
wherein the first and second smart materials are inside the directional material or in a surface of the directional material,
the first smart material is completely on one side of a central plane of the directional material, and the second smart material is completely on an opposite side of the central plane of the directional material, spaced apart from the first smart material, and
at least one of in-plane shear deformation, out-of-plane deformation, and twisting is realized by controlling a position of the first and second smart materials and a directionality of directional material.

6. The actuator of claim 5,
wherein the first and second smart materials are completely outside of a horizontal central plane of the directional material, but in a vertical central plane of the directional material, and
the directional material has orthotropic properties adapted to realize the out-of-plane deformation.

7. The actuator of claim 5,
wherein the first and second smart materials are completely outside of a horizontal central plane of the directional material, but in a vertical central plane of the directional material, and
wherein the directional material has anisotropic properties adapted to realize the out-of-plane deformation and twisting.

8. The actuator of claim 5,
wherein the first and second smart materials are completely outside of a horizontal central plane of the directional material and completely outside of a vertical central plane of the directional material, and
wherein the directional material has orthotropic properties adapted to realize the in-plane shear deformation and out-of-plane deformation.

9. A smart soft composite actuator comprising:
a first smart material and a second smart material whose shapes are changeable based on an external signal;
a directional material configured to restrict deformation in a specific direction; and
a matrix configured to (i) support the smart material and the directional material and (ii) determine an external shape of the smart soft composite actuator,
wherein the first and second smart materials are inside the matrix or in a surface of the matrix,
the first smart material is completely on one side of a central plane of the matrix, and the second smart material is completely on an opposite side of the central plane of the matrix, spaced apart from the first smart material,
the directional material is inside the matrix, and
at least one of in-plane shear deformation, out-of-plane deformation, and twisting is realized by controlling a position of the smart material, a position of the directional material, and a directionality of the directional material.

10. The actuator of claim 9,
wherein the first and second smart materials are in a horizontal central plane of the matrix, but completely outside of a vertical central plane of the matrix, and
the directional material has orthotropic properties adapted to realize the in-plane shear deformation.

11. The actuator of claim 9,
wherein the first and second smart materials are completely outside of a horizontal central plane of the matrix, but in a vertical central plane of the matrix, and
the directional material has orthotropic properties adapted to realize the out-of-plane deformation, and the directional material is in the horizontal central plane of the matrix.

12. The actuator of claim 9,
wherein the first and second smart materials are completely outside of a horizontal central plane of the matrix and completely outside of a vertical central plane of the matrix, and
the directional material has orthotropic properties adapted to realize the in-plane shear deformation and out-of-plane deformation, and the directional material is in the horizontal central plane of the matrix.

13. The actuator of claim 9,
wherein the first and second smart materials are completely outside of a horizontal central plane of the matrix but in a vertical central plane of the matrix, and the directional material has anisotropic properties adapted to realize the out-of-plane deformation and twisting, and the directional material is in the horizontal central plane of the matrix.

14. The actuator of claim 9,
wherein the first and second smart materials are completely outside of a horizontal central plane of the matrix and completely outside of a vertical central plane of the matrix, and the directional material has anisotropic properties adapted to realize the in-plane shear deformation, out-of-plane deformation and twisting, and the directional material is in the horizontal central plane of the matrix.

15. The actuator of claim 9, wherein the matrix comprises a material whose Young's modulus is not more than 1 GPa.

16. The actuator of claim 9, wherein the directional material comprises a material whose Young's modulus is not less than 1 GPa.

17. The actuator of claim 9, wherein the matrix comprises an elastomeric polymer, silicon, or polydimethylsiloxane (PDMS), and has a Young's modulus of not more than 1 GPa.

18. The actuator of claim 5, wherein the directional material comprises a material having a Young's modulus of not less than 1 GPa.

19. The actuator of claim 18, wherein the matrix comprises an elastomeric polymer, silicon, or polydimethylsiloxane (PDMS).

20. The actuator of claim 5, wherein the directional material comprises a mesh structure having openings therein, the directional material has a stiffness in a specific direction that is greater than its stiffness in other directions, and the openings in the mesh structure include the matrix.

* * * * *